(12) United States Patent
Guterman

(10) Patent No.: US 7,170,793 B2
(45) Date of Patent: Jan. 30, 2007

(54) PROGRAMMING INHIBIT FOR NON-VOLATILE MEMORY

(75) Inventor: Daniel C. Guterman, Fremont, CA (US)

(73) Assignee: Sandisk Corporation, Milpitas, CA (US)

( * ) Notice: Subject to any disclaimer, the term of this patent is extended or adjusted under 35 U.S.C. 154(b) by 143 days.

(21) Appl. No.: 10/823,421

(22) Filed: Apr. 13, 2004

(65) Prior Publication Data

US 2005/0226055 A1 Oct. 13, 2005

(51) Int. Cl.
*G11C 11/34* (2006.01)
*G11C 16/04* (2006.01)

(52) U.S. Cl. .................. 365/185.28; 365/185.17; 365/185.18; 365/195

(58) Field of Classification Search .......... 365/185.28, 365/185.18, 185.17, 195
See application file for complete search history.

(56) References Cited

U.S. PATENT DOCUMENTS

| | | | |
|---|---|---|---|
| 5,621,684 A | 4/1997 | Jung et al. | |
| 5,671,176 A | 9/1997 | Jang et al. | |
| 5,991,202 A | 11/1999 | Derhacobian et al. | |
| 6,011,287 A | 1/2000 | Itoh et al. | |
| 6,049,494 A | 4/2000 | Sakui et al. | |
| 6,236,609 B1 | 5/2001 | Tanzawa et al. | |
| 6,243,295 B1 | 6/2001 | Satoh | |
| 6,307,807 B1 | 10/2001 | Sakui et al. | |
| 6,314,026 B1 | 11/2001 | Satoh et al. | |
| 6,370,081 B1 | 4/2002 | Sakui et al. | |
| 6,442,080 B2 | 8/2002 | Tanzawa et al. | |
| 6,469,933 B2 * | 10/2002 | Choi et al. ............. | 365/185.17 |
| 6,504,757 B1 | 1/2003 | Holmer et al. | |
| 6,512,703 B2 | 1/2003 | Sakui et al. | |
| 6,580,639 B1 | 6/2003 | He et al. | |
| 6,614,688 B2 | 9/2003 | Jeong et al. | |
| 6,657,892 B2 | 12/2003 | Sakui et al. | |
| 6,661,707 B2 | 12/2003 | Choi et al. | |
| 6,859,397 B2 * | 2/2005 | Lutze et al. ........... | 365/185.28 |
| 6,977,842 B2 * | 12/2005 | Nazarian ............... | 365/185.18 |
| 2002/0003723 A1 | 1/2002 | Tanzawa et al. | |
| 2002/0021587 A1 | 2/2002 | Sakui et al. | |
| 2002/0114187 A1 | 8/2002 | Choi et al. | |

(Continued)

*Primary Examiner*—Anh Phung
*Assistant Examiner*—Toan Le
(74) *Attorney, Agent, or Firm*—Vierra Magen Marcus & DeNiro LLP

(57) ABSTRACT

A non-volatile memory system is programmed so as to reduce or avoid program disturb. In accordance with one embodiment, the storage elements of a NAND string are partitioned into at least two regions. A first boosting voltage is applied to the first region of the string while a second larger boosting voltage is applied to the second region. The first region includes the addressed row or selected word line for programming. The boosting voltages are applied to the NAND strings of a block while the NAND strings are being inhibited from programming. In this manner, the second boosting voltage can be made larger without inducing program disturb on the memory cells receiving the larger boosting voltage. The boosted voltage potentials of the NAND string channels are trapped within the first region by lowering the boosting voltage on one or more bounding rows. The second boosting voltage is then lowered and data is applied to the bit lines of the NAND strings to select the appropriate strings for programming. The trapped voltage potential discharges or remains in the boosted state for programming depending on whether a string is selected for programming or is to remain inhibited from programming.

51 Claims, 10 Drawing Sheets

U.S. PATENT DOCUMENTS

| | | |
|---|---|---|
| 2002/0118569 A1 | 8/2002 | Jeong et al. |
| 2002/0126532 A1 | 9/2002 | Matsunaga |
| 2003/0048662 A1 | 3/2003 | Park et al. |
| 2003/0072176 A1 | 4/2003 | Watanbe |
| 2004/0105308 A1 | 6/2004 | Matsunaga et al. |
| 2004/0145024 A1* | 7/2004 | Chen et al. .................. 257/390 |
| 2005/0174852 A1* | 8/2005 | Hemink .................. 365/185.28 |

* cited by examiner

| cell # | region | region | region | region | region |
|---|---|---|---|---|---|
| 415 | B | B | A' | S | A' |
| 414 | B | B | S | A' | S |
| 413 | B | B | A' | B | A |
| 412 | B | B | B | B | A |
| 411 | A' | B | B | B | A' |
| 410 | A | B' | B | B | B |
| 409 | A | A | B | B | B |
| 408 | S | S | B | B | B |
| 407 | A | A | B | B | B |
| 406 | A | B' | B | B | B |
| 405 | A' | B | B | B | B |
| 404 | B | B | B | B | B |
| 403 | B | B | B | B | B |
| 402 | B | B | B | B | B |
| 401 | B | B | B | B | B |
| 400 | B | B | B | B | B |

PROGRAMMING INHIBIT FOR NON-VOLATILE MEMORY

BACKGROUND OF THE INVENTION

1. Field of the Invention

The present invention relates generally to technology for programming non-volatile memory devices.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by applying appropriate voltages to control gate 120CG for select gate 120. Select gate 122 is controlled by applying the appropriate voltages to control gate 122CG of select gate 122. Each of the transistors 100, 102, 104 and 106 includes a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

FIG. 3 provides a cross-sectional view of the NAND string described above. As depicted in FIG. 3, the transistors (also called cells or memory cells) of the NAND string are formed in p-well region 140. Each transistor includes a stacked gate structure that consists of the control gate (100CG, 102CG, 104CG and 106CG) and a floating gate (100FG, 102FG, 104FG and 106FG). The floating gates are formed on the surface of the p-well on top of an oxide or other dielectric composite film. The control gate is above the floating gate, with an oxide or other isolating dielectric layer separating the control gate and floating gate. Note that FIG. 3 appears to depict a control gate and floating gate for transistors 120 and 122. However, for transistors 120 and 122, the control gate and the floating gate are electrically connected together. The control gates of the memory cells (100, 102, 104, 106) form the word lines. N+ doped layers 130, 132, 134, 136 and 138 are shared between neighboring cells whereby the cells are connected to one another in series to form a NAND string. These N+ doped layers form the source and drain of each of the cells. For example, N+ doped layer 130 serves as the drain of transistor 122 and the source for transistor of 106, N+ doped layer 132 serves as the drain for transistor 106 and the source for transistor 104, N+ doped region 134 serves as the drain for transistor 104 and the source for transistor 102, N+ doped region 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1–3 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string.

A typical architecture for a flash memory system using a NAND structure will include several NAND strings. For example, FIG. 4 shows three NAND strings 202, 204 and 206 of a memory array having many more NAND strings. Each of the NAND strings of FIG. 4 includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224 and memory cell 244. Word line WL1 is connected to the control gates for memory cell 226 and memory cell 246. Word line WL0 is connected to the control gates for memory cell 228 and memory cell 248. As can be seen, each bit line and the respective NAND string comprise the columns of the array of memory cells. The word lines (WL3, WL2, WL1 and WL0) comprise the rows of the array. Each word line connects the control gates of each memory cell in the row. For example, word line WL2 is connected to the control gates for memory cells 224, 244 and 252.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after a program operation is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored. A memory cell can also store multiple levels of information, for example, multiple bits of digital data. In the case of storing multiple levels of data, the range of possible threshold voltages is divided into the number of levels of data. For example, if four levels of information are stored, there will be four threshold voltage ranges assigned to the data values "11", "10", "01", and "00." In one example of a NAND type memory, the threshold voltage after an erase operation is negative and defined as "11." Positive threshold voltages are used for the states of "10", "01", and "00."

Relevant examples of NAND type flash memories and their operation are provided in the following U.S. Patents/Patent Applications, all of which are incorporated herein by reference: U.S. Pat. No. 5,570,315; U.S. Pat. No. 5,774,397, U.S. Pat. No. 6,046,935, U.S. Pat. No. 6,456,528 and U.S. patent application Ser. No. 09/893,277 (Publication No. U.S. 2003/0002348).

When programming a flash memory cell, a program voltage is applied to the control gate and the bit line is grounded. Electrons from the p-well are injected into the floating gate. When electrons accumulate in the floating gate, the floating gate becomes negatively charged and the threshold voltage of the cell is raised. To apply the program voltage to the control gate of the cell being programmed, that program voltage is applied on the appropriate word line. As discussed above, that word line is also connected to one cell in each of the other NAND strings that utilize the same word line. For example, when programming cell 224 of FIG. 4, the program voltage will also be applied to the control gate of cell 244 because both cells share the same word line. A problem arises when it's desired to program one cell on a word line without programming other cells connected to the same word line, for example, when it's desired to program cell 224 and not cell 244. Because the program voltage is applied to all cells connected to a word line, an unselected cell (a cell that is not to be programmed) connected to the word line, especially a cell adjacent to the cell selected for programming, may become inadvertently programmed. For example, cell 244 is adjacent to cell 224. When programming cell 224, there is a concern that cell 244 might unintentionally be programmed. The unintentional programming of the unselected cell on the selected word line is referred to as "program disturb."

Several techniques can be employed to prevent program disturb. In one method known as "self boosting," the unselected bit lines are electrically isolated and a pass voltage (e.g. 10 volts) is applied to the unselected word lines during programming. The unselected word lines couple to the unselected bit lines, causing a voltage (e.g. eight volts) to be impressed in the channel and source/drain regions of the unselected bit lines, thereby reducing program disturb. Self boosting causes a voltage boost to exist in the channel which lowers the voltage across the tunnel oxide and hence reduces program disturb.

A NAND string is typically (but not always) programmed in sequence from the source side to the drain side, for example, from memory cell 228 to memory cell 222. When the programming process is ready to program the last (or near the last) memory cell of the NAND string, if all or most of the previously programmed cells on the string being inhibited (e.g. string 204) were programmed, then there is negative charge in the floating gates of the previously programmed cells. Because of this negative charge on the floating gates, the boosting potential doesn't get high enough and there still may be program disturb on the last few word lines. For example, when programming cell 242, if cells 248, 246 and 244 were programmed, then each of those transistors (244, 246, 248) have a negative charge on their floating gate which will limit the boosting level of the self boosting process and possibly allow program disturb on cell 242.

The problem discussed above with self boosting has been addressed by two other schemes: Local Self Boosting ("LSB") and Erased Area Self Boosting ("EASB"). Both LSB and EASB attempt to isolate the channel of previously programmed cells from the channel of the cell being inhibited. For example, if cell 224 of FIG. 4 is being programmed, LSB and EASB attempt to inhibit programming in cell 244 by isolating the channel of cell 244 from the previously programmed cells (246 and 248). With the LSB technique, the bit line for the cell being programmed is at ground and the bit line of the string with the cell being inhibited is at Vdd. The program voltage Vpgm (e.g. 20 volts) is driven on the selected word line. The word lines neighboring the selected word line are at zero volts and the remaining non-selected word lines are at Vpass. For example, looking at FIG. 4, bit line 202 is at zero volts and bit line 204 is at Vdd. Drain select SGD is at Vdd and source select SGS is at zero volts. Selected word line WL2 (for programming cell 224) is at Vpgm. Neighboring word lines WL1 and WL3 are at zero volts, and other word lines (e.g. WL0) are at Vpass.

EASB is similar to LSB with the exception that only the source side neighbor word line is at zero volts. For example, WL1 would be at zero volts while WL3 would be at Vpass. In one embodiment, Vpass is 7–10 volts. If Vpass is too low, boosting in the channel is insufficient to prevent program disturb. If Vpass is too high, unselected word lines will be programmed, also a type or form of disturb.

While LSB and EASB provide an improvement over self boosting, they also present a problem that depends on whether the source side neighbor cell (cell 246 is the source side neighbor of cell 244) is programmed or erased. If the source side neighbor cell is programmed, then there is a negative charge on the floating gate of that source side neighbor cell. Zero volts are applied to the control gate. Thus, there is a highly reverse biased junction under the negatively charged gate which can cause Gate Induced Drain Leakage (GIDL). GIDL involves electrons leaking into the boosted channel. GIDL occurs with a large bias in the junction and a low or negative gate voltage, which is precisely the case when the source side neighbor cell is programmed and the drain junction is boosted. GIDL will cause the boosted voltage to leak away prematurely, resulting in a programming error. GIDL is more severe with the abruptly and highly doped junctions, which are required as cell dimensions are scaled. If the leakage current is high enough, the boosting potential in the channel region will go down and there can be program disturb. The closer the word line being programmed is to the drain, the less charge is present in the boosted junction. Thus, the voltage in the boosted junction will drop quickly, causing program disturb.

If the source side neighbor memory cell is erased, then there is positive charge on the floating gate and the threshold voltage of the transistor will likely be negative. The transistor may not turn off even when zero volts is applied to the word line. If the memory cell is on, then the NAND string is not operating in EASB mode. Rather that string is operating in self boosting mode, and self boosting mode has the problems discussed above. This scenario is most likely if other source side cells are programmed, which limits source side boosting. This issue is most problematic with shorter channel lengths.

In addition to the identified problems of each of the aforementioned prior art techniques for reducing or preventing program disturb, the amount of pass or boosting voltage that is applied to unselected world lines has an upper and lower limit. If the pass voltage is below a certain level, insufficient boosting of the channel will occur and programming of an addressed memory cell that is to be fully inhibited can occur. Program disturb experienced by memory cells connected to a word line selected for programming is this manner is often referred to as "on-row" program disturb. If the pass voltage applied to an unselected word line is raised too high, a programming disturb condition can be induced on memory cells connected to the unselected word line that are part of a NAND string having a bit line biased to enable programming (e.g., sitting at 0 volts). That is, application of the pass voltage to a memory cell whose bit line is targeted for programming can lead to programming of that memory cell. Program disturb experienced by memory cells connected a word line receiving a pass voltage is often referred to as "off-row" program disturb.

Thus, there is a need for a better mechanism to prevent program disturb.

SUMMARY OF THE INVENTION

The present invention, roughly described, pertains to technology for programming memory devices in a manner that reduces or avoids program disturb. In accordance with one embodiment, the storage elements of a NAND string are partitioned into at least two regions. A first boosting voltage is applied to the first region of the string while a second larger boosting voltage is applied to the second region. The first region includes the addressed row or selected word line for programming. The first and second boosting voltages are applied to all the NAND strings of a targeted block while inhibiting all of the NAND strings from being programmed, independent of the data to be programmed. In this manner, the second boosting voltage can be made larger without inducing program disturb on the memory cells receiving the larger boosting voltage. The channel of a NAND string will be boosted to a voltage potential that is a result of capacitive coupling between the first boosting voltage and the second boosting voltage. The boosted voltage potentials of the NAND string channels are then trapped within all or part of the first region by lowering the boosting voltage on one or more bounding rows (in one embodiment). The second boosting voltage is then lowered and data is applied to the bit lines of the NAND strings to select the appropriate strings for programming (e.g., by taking the selected string bit lines to 0 volts). In this way, the trapped voltage potential discharges from NAND strings selected for programming, while remaining in the boosted state during programming for NAND strings including a storage element to be inhibited.

In one embodiment, a method of programming non-volatile memory includes boosting a voltage potential of a channel of a first group of non-volatile storage elements, trapping at least a portion of the voltage potential in a region of the channel associated with a first subset of the first group of non-volatile storage elements, and enabling programming of a second group of non-volatile storage elements subsequent to trapping the voltage potential. Boosting the voltage potential can include applying a first boosting voltage to the first subset of the first group and applying a second boosting voltage to a second subset of the first group. The second boosting voltage can be lowered after trapping the voltage potential but prior to enabling programming to the second group of non-volatile storage elements so as to avoid off-row program disturb from a large second boosting voltage. Accordingly, the second boosting voltage can be of a size that may normally cause programming of a memory cell of a string having its bit line biased for programming. In one embodiment, programming of the first group and the second group is inhibited while the second boosting voltage is applied. In one embodiment, the voltage potential is trapped in a region of the channel associated with the first subset of storage elements by lowering the boosting voltage on one or more word lines that bound the first subset.

In one embodiment, the first group of non-volatile storage elements is a first string of NAND storage elements and the second group of non-volatile storage elements is a second string of NAND storage elements. The first group includes a first and second subset of elements, the first subset including a storage element to be inhibited. The second group includes a first and second subset of elements, the first subset including a storage element to be programmed. The storage element to be inhibited and the storage element to be programmed are both coupled to the same word line. Boosting the voltage potential of the channel of the first group includes applying at least a first boosting voltage to the first subset of both the first and second groups and at least a second boosting voltage to the second subset of both the first and second groups. The second boosting voltage is applied while inhibiting programming to both groups of storage elements.

In accordance with one embodiment, a non-volatile memory system includes: a first group of non-volatile storage elements having a first subset of non-volatile storage elements that includes a non-volatile storage element to be inhibited; a second group of non-volatile storage elements having a first subset of non-volatile storage elements that includes a non-volatile storage element to be programmed; and a plurality of word lines coupled to the first and second group to apply a boosting voltage to raise a voltage potential of a channel of the first group. The plurality of word lines includes a first word line coupled to the storage element to be inhibited and to the storage element to be programmed in order to apply a program voltage to the storage element to be programmed during a program operation. The plurality of word lines also includes at least one bounding word line having the boosting voltage lowered thereon, prior to applying the program voltage, in order to trap the voltage potential in a region of the channel associated with said first subset of said first group.

Other features, aspects, and objects of the invention can be obtained from a review of the specification, the figures, and the claims.

BRIEF DESCRIPTION OF THE DRAWINGS

FIG. 12a depicts a cross section of an exemplary NAND string.

FIG. 12b is a table illustrating various partitions or region assignments of one or more NAND strings such as the NAND string of FIG. 12a.

DETAILED DESCRIPTION

The invention is illustrated by way of example and not by way of limitation in the figures of the accompanying drawings in which like references indicate similar elements. It should be noted that references to an or one embodiment in this disclosure are not necessarily to the same embodiment, and such references mean at least one.

In the following description, various aspects of the present invention will be described. However, it will be apparent to those skilled in the art that the present invention may be practiced with only some or all aspects of the present disclosure. For purposes of explanation, specific numbers, materials, and configurations are set forth in order to provide a thorough understanding of the present invention. However, it will be apparent to one skilled in the art that the present invention may be practiced without the specific details. In other instances, well-known features are omitted or simplified in order not to obscure the present invention.

Various operations will be described as multiple discrete steps in turn, in a manner that is most helpful in understanding the present invention, however, the order of description should not be construed as to imply that these operations are necessarily order dependent.

Figure 5:
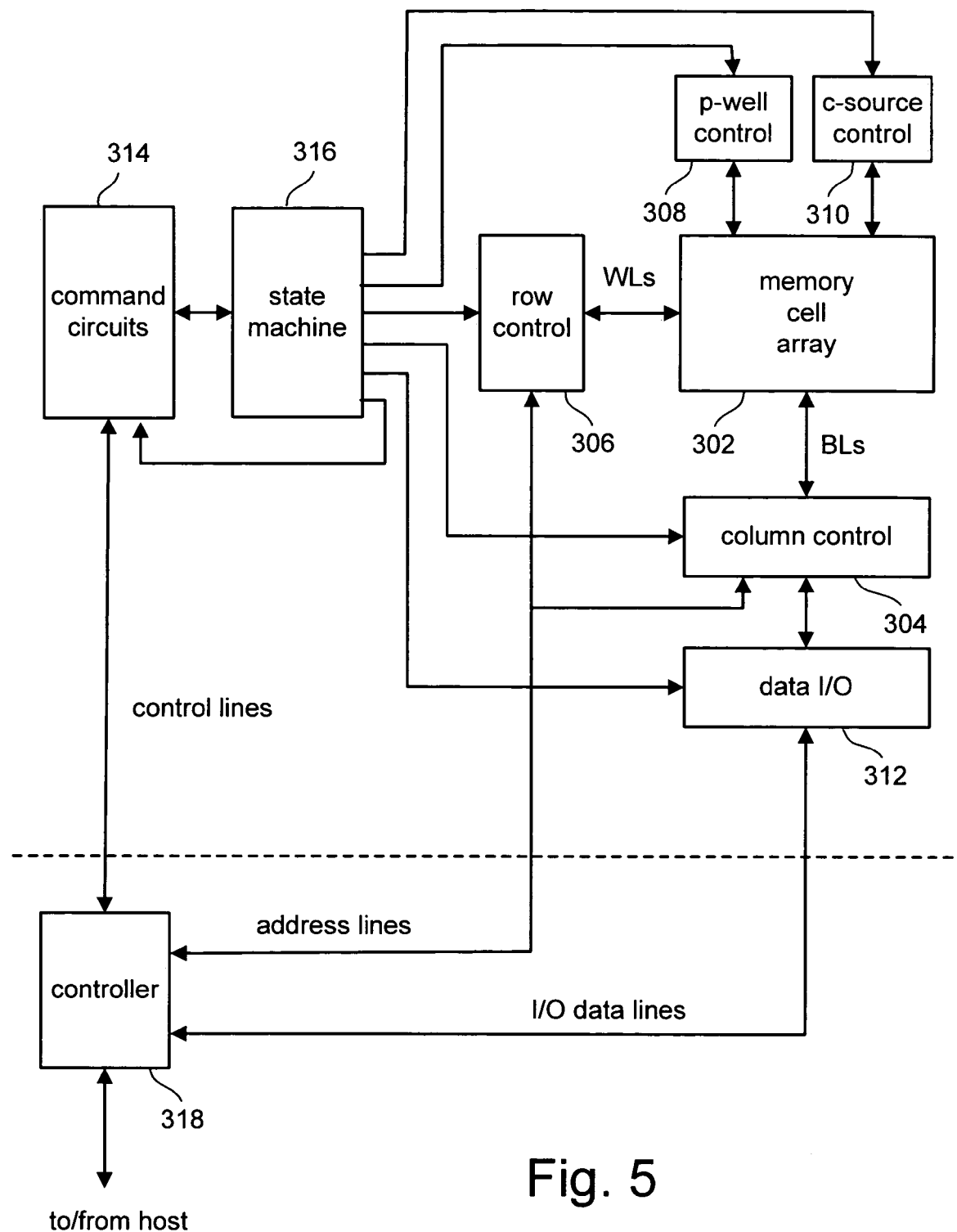
FIG. 5 is a block diagram of one embodiment of a non-volatile memory system in which the various aspects of the present invention can be implemented.

FIG. 5 is a block diagram of one embodiment of a flash memory system that can be used to implement the present invention. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote or inhibit programming and erasing. Row control circuit 306 is connected to the word lines to select one of the word lines, to apply read voltages, to apply program voltages combined with the bit line potential levels controlled by column control circuit 304, and to apply an erase voltage. C-source control circuit 310 controls a common source line (labeled as "C-source" in FIG. 6) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device are input to controller 318. The command data informs the flash memory of what operation is requested. The input command is transferred to state machine 316 that controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected to or connectable with a host system such as a personal computer, a digital camera, or personal digital assistant, etc. It communicates with the host that initiates commands, such as to store or read data to or from the memory array 302, and provides or receives such data. Controller 318 converts such commands into command signals that can be interpreted and executed by command circuits 314, which is in communication with state machine 316. Controller 318 typically contains buffer memory for the user data being written to or read from the memory array.

One exemplary memory system comprises one integrated circuit that includes controller 318, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the Controller or control function being embedded in the host). Thus, the controller can be embedded in the host or included within the removable memory system.

Figure 6:
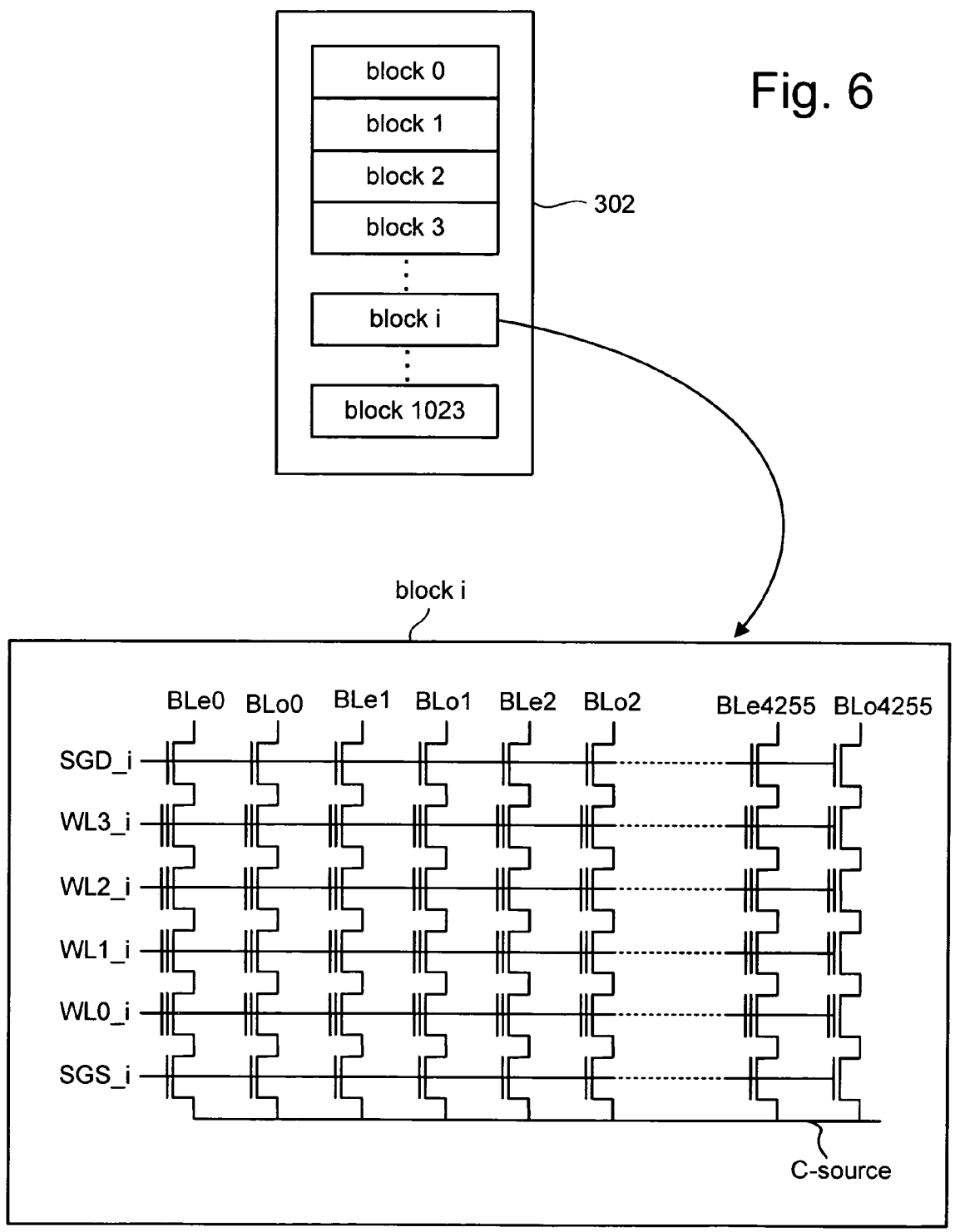
FIG. 6 illustrates an exemplary organization of a memory array.

With reference to FIG. 6, an exemplary structure of memory cell array 302 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 5 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor SGD, and another terminal is connected to c-source via a second select transistor SGS.

During read and programming operations of one embodiment, 4,256 memory cells are simultaneously selected. The memory cells selected have the same word line (e.g. WL2-i), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages.

Memory cells are erased in one embodiment by raising the p-well to an erase voltage (e.g. 20 volts) and grounding the word lines of a selected block while the source and bit lines are floating. Due to capacitive coupling, the unselected word lines (e.g., those in unselected, not to-be-erased blocks), bit lines, select lines, and c-source are also raised to a high positive potential (e.g., 20V). A strong electric field is thus applied to the tunnel oxide layers of memory cells of a selected block and the data of the selected memory cells are erased as electrons of the floating gates are emitted to the substrate. As sufficient electrons are transferred from the floating gate to the p-well region, the threshold voltage of a selected cell becomes negative. Erasing can be performed on the entire memory array, multiple blocks of the array, or another unit of cells.

In the read and verify operations, the select gates (SGD and SGS) of a selected block are raised to one or more select voltages and the unselected word lines (e.g., WL0, WL1 and WL3) of the selected block are raised to a read pass voltage (e.g. 4.5 volts) to make the transistors operate as pass gates. The selected word line of the selected block (e.g. WL2) is connected to a reference voltage, a level of which is specified for each read and verify operation in order to determine whether a threshold voltage of the concerned memory cell is above or below such level. For example, in a read operation of a one bit memory cell, the selected word line WL2 is grounded, so that it is detected whether the threshold voltage is higher than 0V. In a verify operation of a one bit memory cell, the selected word line WL2 is connected to 2.4V, for example, so that as programming progresses it is verified whether or not the threshold voltage has reached 2.4V. The source and p-well are at zero volts during read and verify. The selected bit lines (BLe) are pre-charged to a level of, for example, 0.7V. If the threshold voltage is higher than the read or verify level, the potential level of the concerned bit line (BLe) maintains the high level, because of the associated non-conductive memory cell. On the other hand, if the threshold voltage is lower than the read or verify level, the potential level of the concerned bit line (BLe) decreases to a low level, for example less than 0.5V, because of the conductive memory cell. The state of the memory cell is detected by a sense amplifier that is connected to the bit line and senses the resulting bit line voltage. The difference between whether the memory cell is programmed or erased depends on whether or not net negative charge is stored in the floating gate. For example, if negative charge is stored in the floating gate, the threshold voltage becomes higher and the transistor can be in enhancement mode of operation.

The erase, read and verify operations described above are performed according to techniques known in the art. Thus, many of the details explained can be varied by one skilled in the art.

When programming a memory cell in one example, the drain and the p-well receive 0 volts while the control gate receives a series of programming pulses with increasing magnitudes. In one embodiment, the magnitudes of the pulses in the series range from 7 volts to 20 volts. In other embodiments, the range of pulses in the series can be different, for example, having a starting level of 12 volts. During programming of memory cells, verify operations are carried out in the periods between the programming pulses. That is, the programming level of each cell of a group of cells being programmed in parallel is read between each programming pulse to determine whether or not it has reached or exceeded a verify level to which it is being programmed. One means of verifying the programming is to test conduction at a specific compare point. The cells that are verified to be sufficiently programmed are locked out, for example in NAND cells, by raising the bit line voltage from 0 to Vdd (e.g., 2.5 volts) for all subsequent programming pulses to terminate the programming process for those cells. In some cases, the number of pulses will be limited (e.g. 20 pulses) and if a given memory cell is not sufficiently programmed by the last pulse, an error is assumed. In some implementations, memory cells are erased (in blocks or other units) prior to programming.

Figure 7:
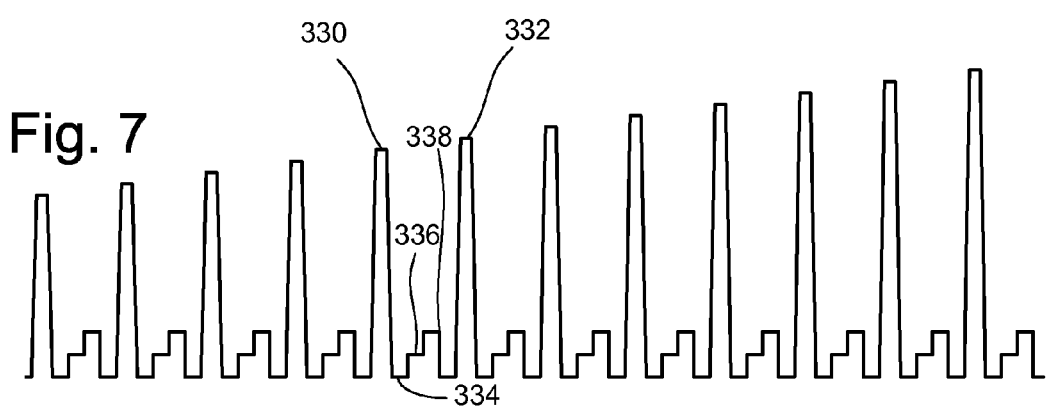
FIG. 7 depicts an exemplary program/verify voltage signal that can be applied to a selected word line in accordance with embodiments.

FIG. 7 depicts a program voltage signal in accordance with one embodiment. This signal has a set of pulses with increasing magnitudes. The magnitude of the pulses is increased with each pulse by a predetermined step size. In one embodiment that includes the memory cells storing multiple bits of data, an exemplary step size is 0.2 volts. Between each of the program pulses are the verify pulses. The signal of FIG. 7 assumes a four state memory cell, therefore, it includes three verify pulses. For example, between programming pulses 330 and 332 are three sequential verify pulses. The first verify pulse 334 is depicted at a zero volt verify voltage level. The second verify pulse 336 follows the first verify pulse at the second verify voltage level. The third verify pulse 338 follows the second verify pulse 336 at the third verify voltage level. A multi-state memory cell capable of storing data in eight states may need to perform verify operations for seven compare points. Thus, seven verify pulses are applied in sequence to perform seven verify operations at seven verify levels between two consecutive programming pulses. Based on the seven verify operations, the system can determine the state of the memory cells. One means for reducing the time burden of verifying is to use a more efficient verify process, for example, as disclosed in U.S. patent application Ser. No. 10/314,055, entitled "Smart Verify for Multi-State Memories," filed Dec. 5, 2002, incorporated herein by reference in its entirety.

Figure 8:
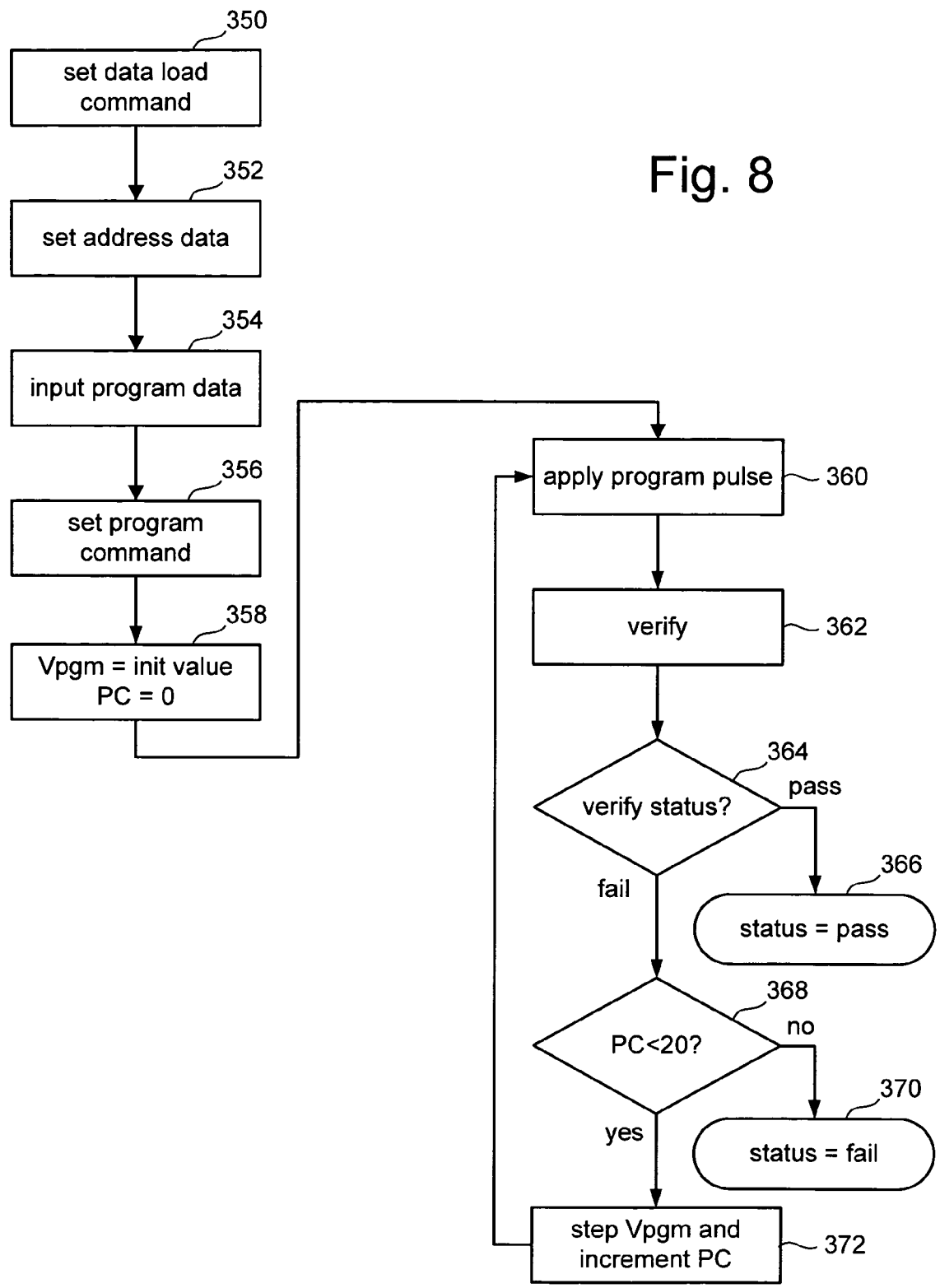
FIG. 8 is an exemplary flowchart for performing a program operation in accordance with one embodiment.

FIG. 8 is a flow chart describing a method for programming a non-volatile memory system. As will be apparent to those of ordinary skill in the art, various steps can be modified, added, or removed depending on a specific application or implementation while still remaining within the scope and spirit of the present disclosure. In various implementations, memory cells are erased (in blocks or other units) prior to programming. At step 350 of FIG. 8 (and in reference to FIG. 5), a data load command is issued by controller 318 and input to command circuit 314, allowing data to be input to data input/output buffer 312. The input data is recognized as a command and latched by state machine 316 via a command latch signal, not illustrated, input to command circuits 314. In step 352, address data designating the page address is input to row controller 306 from controller 318. The input data is recognized as the page address and latched via state machine 316, effected by the address latch signal input to command circuits 314. At step 354, 532 bytes of program data are input to data input/output buffer 312. It should be noted that 532 bytes of program data are specific to the particular implementation described, and other implementations will require or utilize various other sizes of program data. That data can be latched in a register for the selected bit lines. In some embodiments, the data is also latched in a second register for the selected bit lines to be used for verify operations. At step 356, a program command is issued by controller 318 and input to data input/output buffer 312. The command is latched by state machine 316 via the command latch signal input to command circuits 314

At step 358, Vpgm, the programming pulse voltage level applied to the selected word line, is initialized to the starting pulse (e.g. 12 volts), and a program counter PC maintained by state machine 316, is initialized at 0. At step 360, a program voltage (Vpgm) pulse is applied to the selected word line, for example WL2 of FIG. 4 or WL3 of FIG. 12a. The bit lines that include a memory cell to be programmed are grounded to enable programming, while the other bit lines are connected to Vdd to inhibit programming during application of the programming pulse. More details of step 360, including various boosting and programming inhibit systems and techniques will be provided below.

At step 362, the states of the selected memory cells are verified. If it is detected that the target threshold voltage of a selected cell has reached the appropriate level (for example, the programmed level for logic 0 or a particular state of a multi-state cell), then the selected cell is verified as programmed to its target state. If it is detected that the threshold voltage has not reached the appropriate level, the selected cell is not verified as programmed to its target state. Those cells verified as programmed to their target state at step 362 will be excluded from further programming. At step 364, it is determined whether all cells to be programmed have been verified to have programmed to their corresponding states, such as by checking an appropriate data storage register designed to detect and signal such a status. If so, the programming process is complete and successful because all selected memory cells were programmed and verified to their target states. A status of pass is reported in step 366. If at step 364, it is determined that not all of the memory cells have been so verified, then the programming process continues. At step 368, the program counter PC is checked against a program limit value. One example of a program limit value is 20. If the program counter PC is not less than 20, then the program process is flagged as failed and a status of fail is reported at step 370. If the program counter PC is less than 20, then the Vpgm level is increased by the step size and the program counter PC is incremented at step 372. After step 372, the process loops back to step 360 to apply the next Vpgm program pulse.

The flowchart of FIG. 8 depicts a single-pass programming method as can be applied for binary storage. In a two-pass programming method as can be applied for multi-level storage, and as hereinafter described, for example, multiple programming or verification steps may be used in a single iteration of the flowchart. Steps 360–372 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

Figure 9:
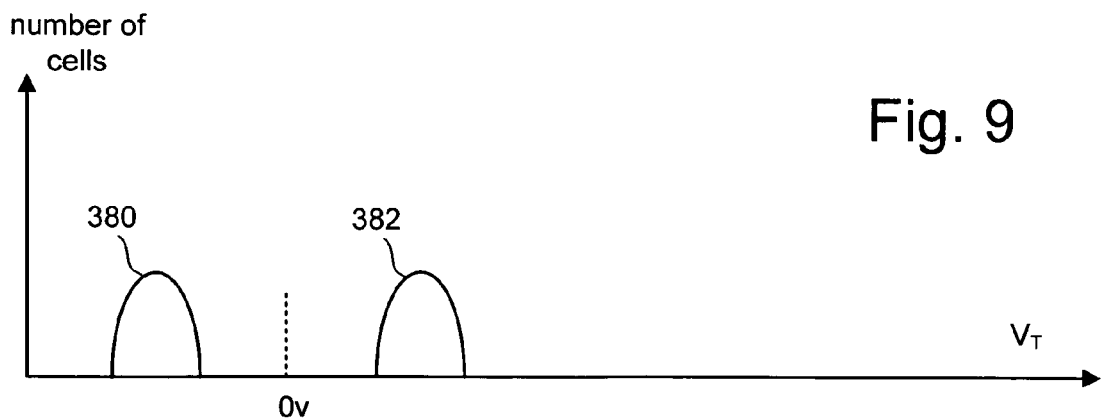
FIG. 9 depicts exemplary threshold distributions of a group of memory cells programmed to two states.

At the end of a successful program process, the threshold voltages of the memory cells should be within one or more distributions of threshold voltages for programmed memory cells or within a distribution of threshold voltages for erased memory cells. FIG. 9 illustrates threshold voltage distributions for the memory cell array when each memory cell stores one bit of data. FIG. 9 shows a first distribution 380 of threshold voltages for erased memory cells and a second distribution 382 of threshold voltages for programmed memory cells. In one embodiment, the threshold voltage levels in the first distribution are negative and the threshold voltage levels in the second distribution are positive.

Figure 10:
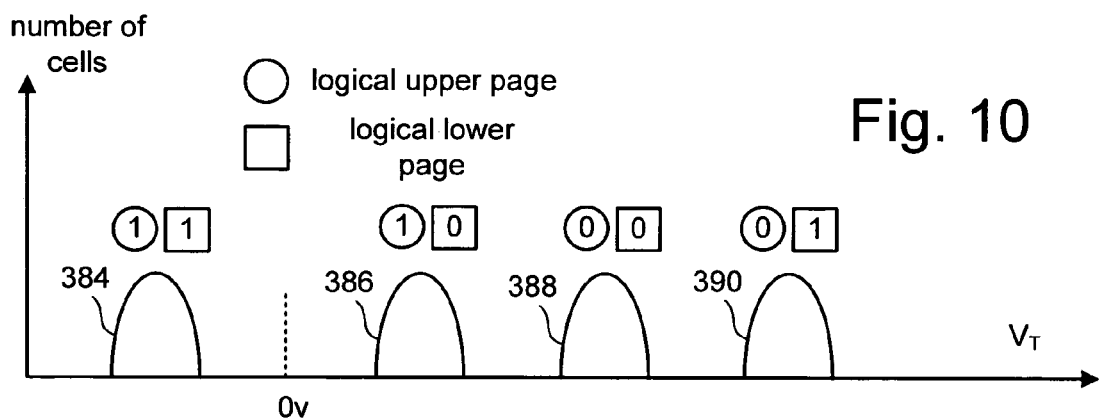
FIG. 10 depicts exemplary threshold distributions of a group of memory cells programmed to four states.

FIG. 10 illustrates exemplary threshold voltage distributions for a memory cell array when each memory cell stores two bits of data in four physical states. Distribution 384 represents a distribution of threshold voltages of cells that are in an erased state (storing "11"), having negative threshold voltage levels. Distribution 386 represents a distribution of threshold voltages of cells that are in a first programmed state, storing "10." Distribution 388 represents a distribution of threshold voltages of cells that are in a second programmed state, storing "00." Distribution 390 represents a distribution of threshold voltages of cells that are in a third programmed state, storing "01." Each of the two bits stored in a single memory cell, in this example, is from a different logical page. That is, each bit of the two bits stored in each memory cell carries a different logical page address. The bit displayed in the square corresponds to a lower page. The bit displayed in the circle corresponds to an upper page. In one embodiment, the logical states are assigned to the sequential physical states of memory cells using a gray code sequence so that if the threshold voltage of a floating gate erroneously shifts to its nearest neighboring threshold voltage state range, only one bit will be affected. In order to provide improved reliability, it is preferable for the individual distributions to be tightened (distribution narrowed), because the tighter distribution brings a wider read margin (distance between adjacent state threshold distributions).

Figure 11:
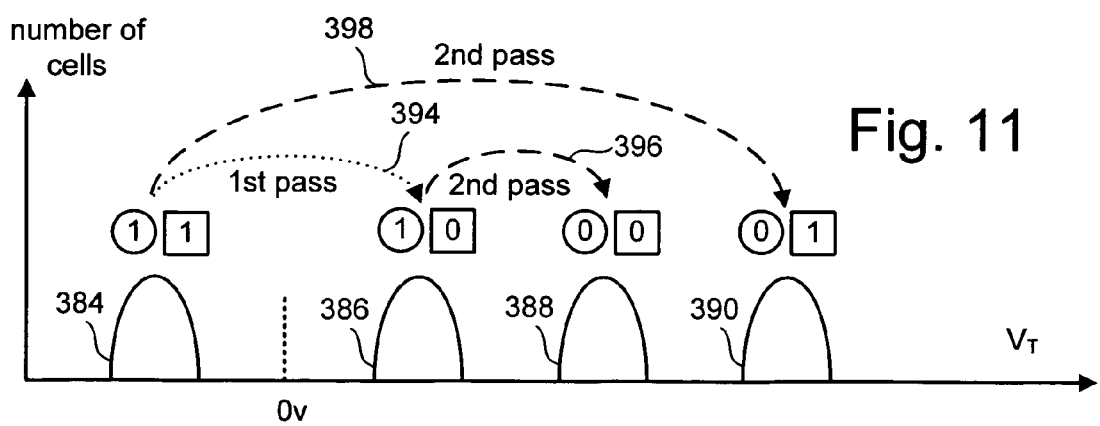
FIG. 11 depicts exemplary threshold distributions of a group of memory cells and an exemplary process for programming multi-state memory cells.

FIG. 11 illustrates an example of a two pass technique of programming a 4-state NAND memory cell such as a memory cell of the array whose threshold voltage distributions are illustrated in FIG. 10. In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be within threshold voltage distribution 386, as shown by arrow 394. That concludes the first programming pass.

In a second programming pass, the cell's threshold voltage level is set according to the bit being programmed into the upper logical page in conjunction with the existing logic level established by the first programming pass. If the upper logical page bit is to store a logic "1," then no programming occurs since the cell is in one of the physical states corresponding to threshold voltage distributions 384 or 386, depending upon the programming of the lower page bit, both of which carry an upper page bit of "1." If the upper page bit is to be a logic "0," however, the cell is programmed a second time. If the first pass resulted in the cell remaining in the erased state corresponding to threshold distribution 384, then in the second phase the cell is programmed so that the threshold voltage is increased to be within threshold distribution 390, as shown by arrow 398. If the cell had been programmed into the state corresponding to threshold distribution 386 as a result of the first programming pass, then the memory cell is further programmed in the second pass so that the threshold voltage is increased to be within threshold voltage distribution 388, as depicted by arrow 396. The result of the second pass is to program the cell into the state designated to store a logic "0" for the upper page without changing the logical state of the first programming pass.

Of course, if the memory is operated with more than four physical states then there will be a number of threshold voltage distributions within the defined voltage threshold window of the memory cells that is equal to the number of states. Further, although specific bit patterns have been assigned to each of the distributions or physical states, different bit patterns may be so assigned, in which case the states between which programming occurs can be different than those depicted in FIGS. 9–11.

Figure 1:
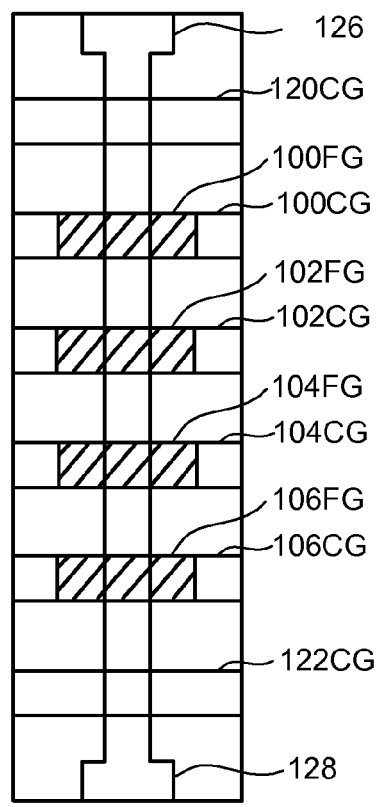
FIG. 1 is a top view of a NAND string.
Figure 2:
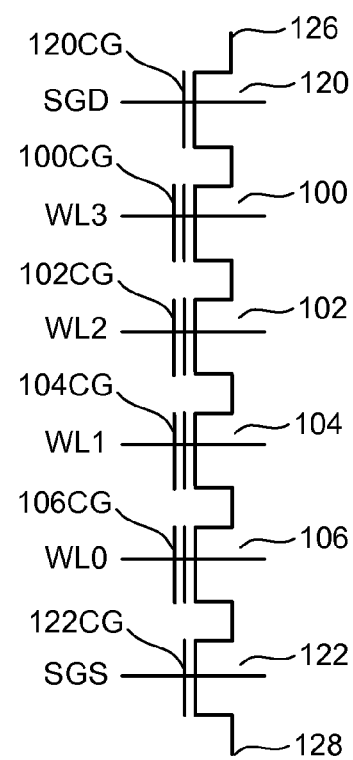
FIG. 2 is an equivalent circuit diagram of the NAND string depicted in FIG. 1.
Figure 3:
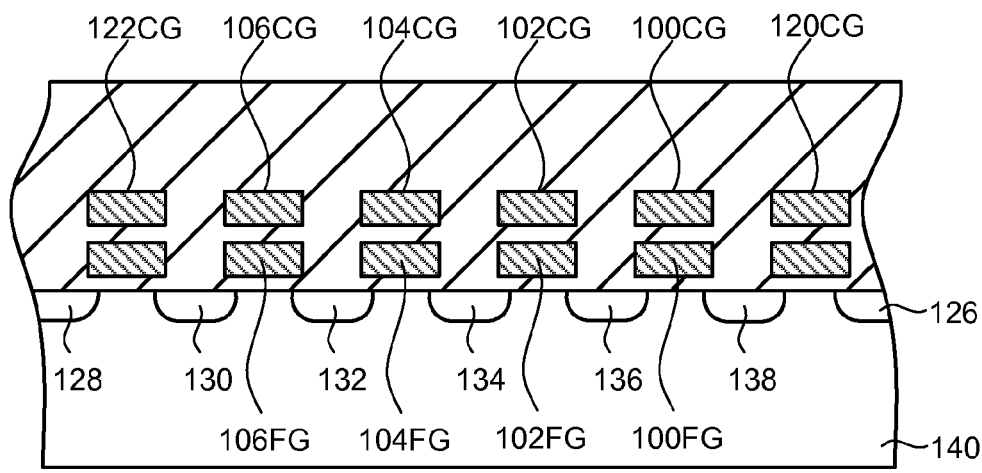
FIG. 3 is a cross sectional view of the NAND string of FIG. 1.
Figure 4:
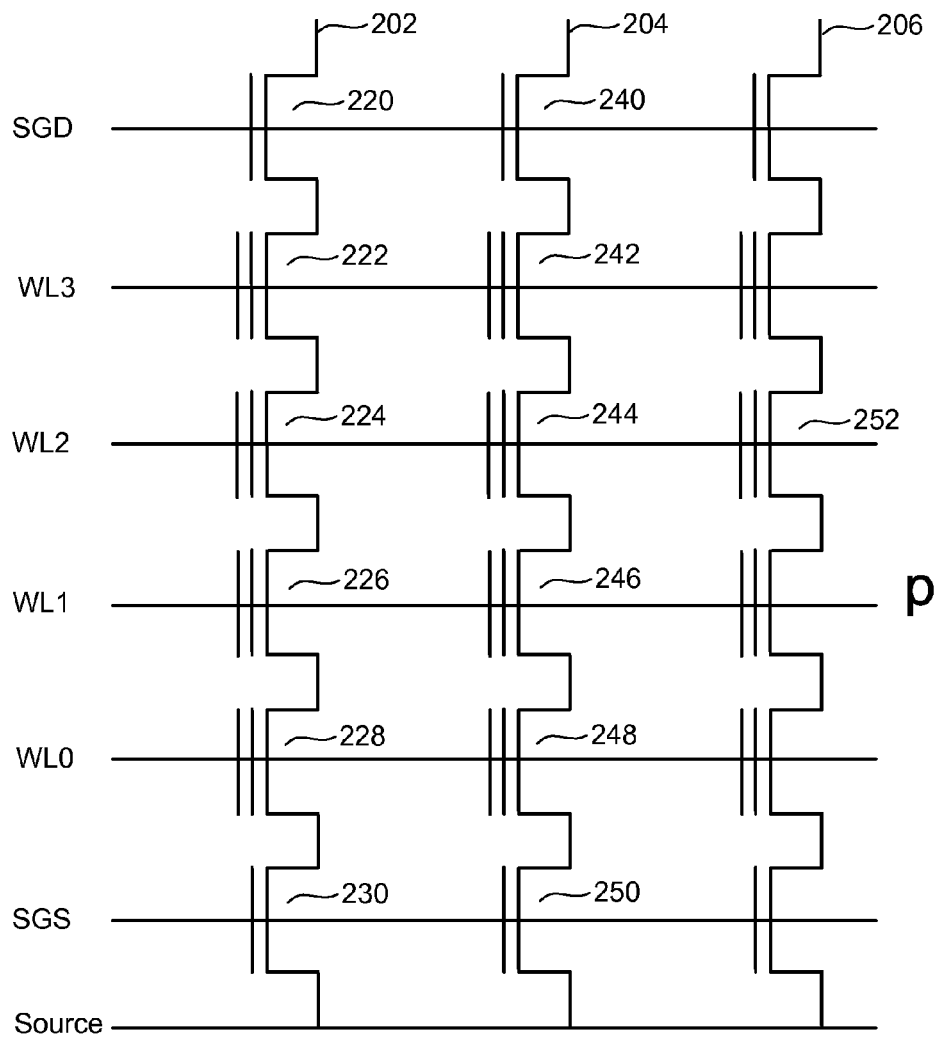
FIG. 4 is a circuit diagram depicting three NAND strings.

Normally, the cells being programmed in parallel are alternate ones along a word line. For example, FIG. 4 illustrates three memory cells 224, 244 and 252 of a much larger number of cells along one word line WL2. One set of alternate cells, including cells 224 and 252, store bits from logical pages 0 and 2 ("even pages"), while another set of alternate cells, including the cell 244, store bits from logical pages 1 and 3 ("odd pages").

As described above, each iteration of step 360 of FIG. 8 includes the application of a programming voltage such as a pulse (Vpgm). A program voltage is applied to the control gate of a memory cell selected for programming by applying the program voltage to the appropriate word line. As previously discussed, a common word line architecture creates the potential to inadvertently program unselected memory cells or otherwise cause program disturb during programming. For example, when programming memory cell 224 of FIG. 4, a program voltage is also applied to memory cell 244 because it is also connected to WL2. The channel of a NAND string containing a memory cell not to be programmed but connected to a word line selected for programming (an addressed but not selected memory cell) is typically boosted above a minimum level to ensure program disturb below a predetermined level.

The level of boosting that can be achieved is limited in part because of off-row disturbance considerations. A pass or boosting voltage is typically applied to one or more of the unselected rows during programming. The rows receiving a pass voltage are often referred to as pass rows. If the pass voltage is too high, a memory cell coupled to a bit line of a to-be-programmed cell and to a word line of a pass row may inadvertently be programmed or disturbed to some degree. For example, an erased memory cell (having a low threshold voltage) in a NAND string selected for programming (e.g., having 0V applied to the respective bit line) may experience program disturb because of exposure to the excessively high pass voltage.

In accordance with one embodiment, a boosting voltage is applied to the NAND strings of a selected memory block, with each NAND string biased to inhibit programming. The bit lines of NAND strings containing memory cells to be programmed as well as the bit lines of NAND strings not containing a selected memory cell are driven with an inhibit potential prior to applying the boosting voltage. In one embodiment, the NAND strings are partitioned into various regions that receive varying boosting voltages. For example, a first boosting voltage is applied to a first region containing the selected word line, and optionally, one or more other word lines. A substantially higher boosting voltage level is applied to a second region. Because each NAND string is inhibited from programming when the above boosting voltages are applied, a higher boosting voltage can be applied to the word lines in the second region without inducing off-row program disturb in their associated cells. The boosting voltage applied to word lines in the second region is not limited by the same off-row disturbance considerations associated with grounded NAND strings that are part of conventional boosting techniques that apply the boosting voltage(s) while a selected NAND string is biased for programming (e.g., bit line driven to 0V).

Application of the boosting voltages will cause an elevated voltage potential in the channel of a NAND string. This voltage potential can be trapped in a channel and source/drain region within a NAND string, including that associated with the selected word line (and consequently, the selected cell of a first NAND string and an unselected cell of a second NAND string). After trapping the voltage potential in the region of the selected word line, the elevated boosting voltage applied to the second region can be lowered. After lowering the boosting voltage, the bit lines of strings to be programmed can be driven to a program enable voltage (e.g., 0V) and a programming pulse applied. Because the higher boosting voltage is applied only while each NAND string is biased to inhibit programming, the occurrence of off-row program disturb associated with the above condition is minimized or eliminated.

Figures 12A, 12B:
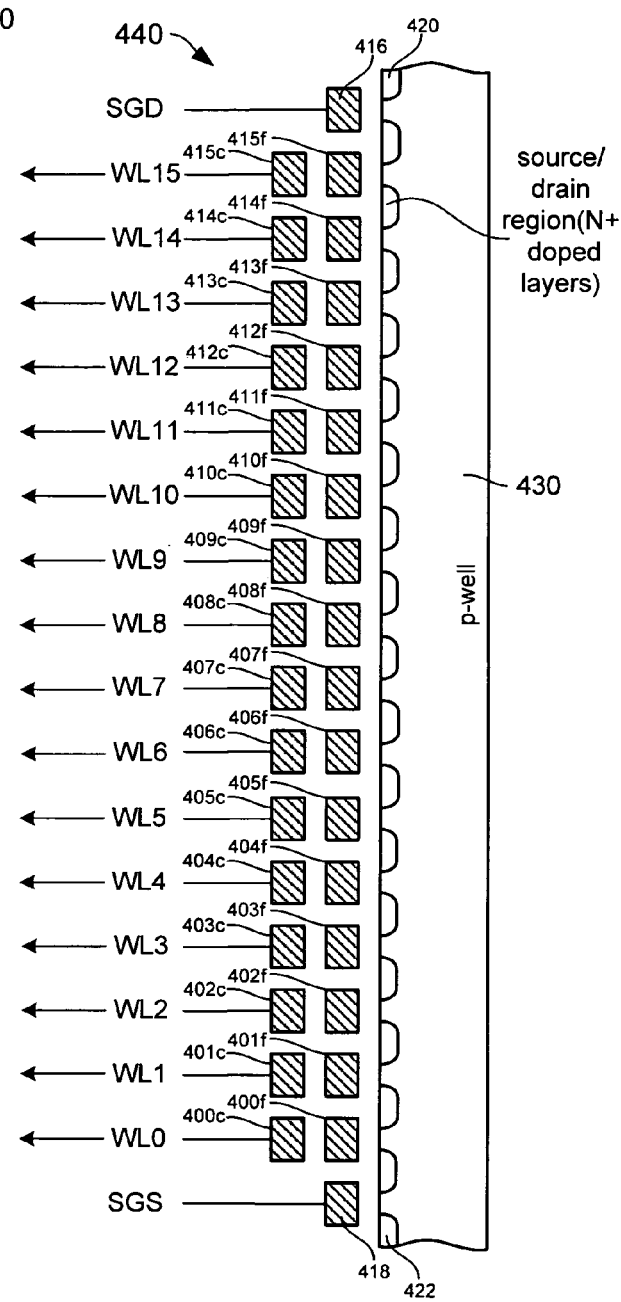

FIG. 12*a* depicts a cross-section of an exemplary NAND string in accordance with one embodiment. For exemplary purposes only, the NAND string in FIG. 12A shows 16 memory cells connected in series. More or less than 16 memory cells can be used in accordance with various embodiments. A first memory cell 400 has a floating gate 400*f* and a control gate 400*c*. Control gate 400*c* is connected to WL0. A second memory cell 401, has a floating gate 401*f* and a control gate 401*c*. Control gate 401*c* is connected to WL1. Memory cell 402 has a floating gate 402*f* and a control gate 402*c*. Control gate 402*c* in connected to WL2. Memory cell 403 has a floating gate 403*f* and a control gate 403*c*. Control gate 403*c* in connected to WL3. Memory cell 404 has a floating gate 404*f* and a control gate 404*c*. Control gate 404*c* in connected to WL4. Memory cell 405 has a floating gate 405*f* and a control gate 405*c*. Control gate 405*c* in connected to WL5. Memory cell 406 has a floating gate 406*f* and a control gate 406*c*. Control gate 406*c* in connected to WL6. Memory cell 407 has a floating gate 407*f* and a control gate 407*c*. Control gate 407*c* in connected to WL7. Memory cell 408 has a floating gate 408*f* and a control gate 408*c*. Control gate 408*c* in connected to WL8. Memory cell 409 has a floating gate 409*f* and a control gate 409*c*. Control gate 409*c* in connected to WL9. Memory cell 410 has a floating gate 410*f* and a control gate 410*c*. Control gate 410*c* in connected to WL10. Memory cell 411 has a floating gate 411*f* and a control gate 411*c*. Control gate 411*c* in connected to WL11. Memory cell 412 has a floating gate 412*f* and a control gate 412*c*. Control gate 412*c* in connected to WL12. Memory cell 413 has a floating gate 413*f* and a control gate 413*c*. Control gate 413*c* in connected to WL13. Memory cell 414 has a floating gate 414*f* and a control gate 414*c*. Control gate 414*c* in connected to WL14. Memory cell 415 has a floating gate 415*f* and a control gate 415*c*. Control gate 415*c* in connected to WL15. Each of the memory cells are on p-well 430. The NAND string is connected to a bit line, which is coupled with N+ doped layer 420, via a select gate having control gate 416. Control gate 416 is coupled with a drain side select gate line SGD. The NAND string is connected to a common source line, which is coupled with N+ doped layer 422, via control gate 418. Control gate 418 is coupled with a source side select gate line SGS.

FIG. 12*b* is a table illustrating exemplary partitions or region designations for one or more NAND strings such as NAND string 440 to inhibit programming to unselected memory cells. The use of 16 memory cells is provided as an example. Other embodiments may include four memory cells, 8 memory cells, 32 memory cells, etc. Each memory cell of the NAND string is listed in column 450 and is associated with one of word lines 0–15. A first exemplary partition or region designation is illustrated in column 452. It will be appreciated by one of ordinary skill that the designations can refer to both a NAND string containing a memory cell selected for programming and a NAND string containing memory cells to be inhibited during programming. For example, memory cell 408 is denoted as 'S' in column 452 to refer to the selection of word line WL8 during the ensuing programming operation. WL8 is associated with at least one memory cell to be programmed and at least one memory cell to be inhibited. Thus, memory cell 408 may be a cell to be programmed or to be inhibited during the operation. One or more strings of the block will be selected for programming while one or more other strings will be inhibited from programming.

Memory cells 405, 406, 407, 409, 410, 411, along with addressed memory cell 408, comprise the first region (region A) in the partition of column 452. The remaining memory cells, 400, 401, 402, 403, 404, 412, 413, 414 and 415 comprise the second region, region B. In accordance with various embodiments, more or less than seven memory cells other than the selected memory cell can form region A. Likewise, more or less than nine memory cells can form Region B. Memory cells 405 and 411 are part of region A and receive an A-region boosting voltage but are bounding rows and are designated A'. In one embodiment, bounding rows are not included within region A. The bounding rows can additionally or optionally be included within region B and receive a B-region boosting voltage as will be more fully discussed hereinafter.

Figure 13:
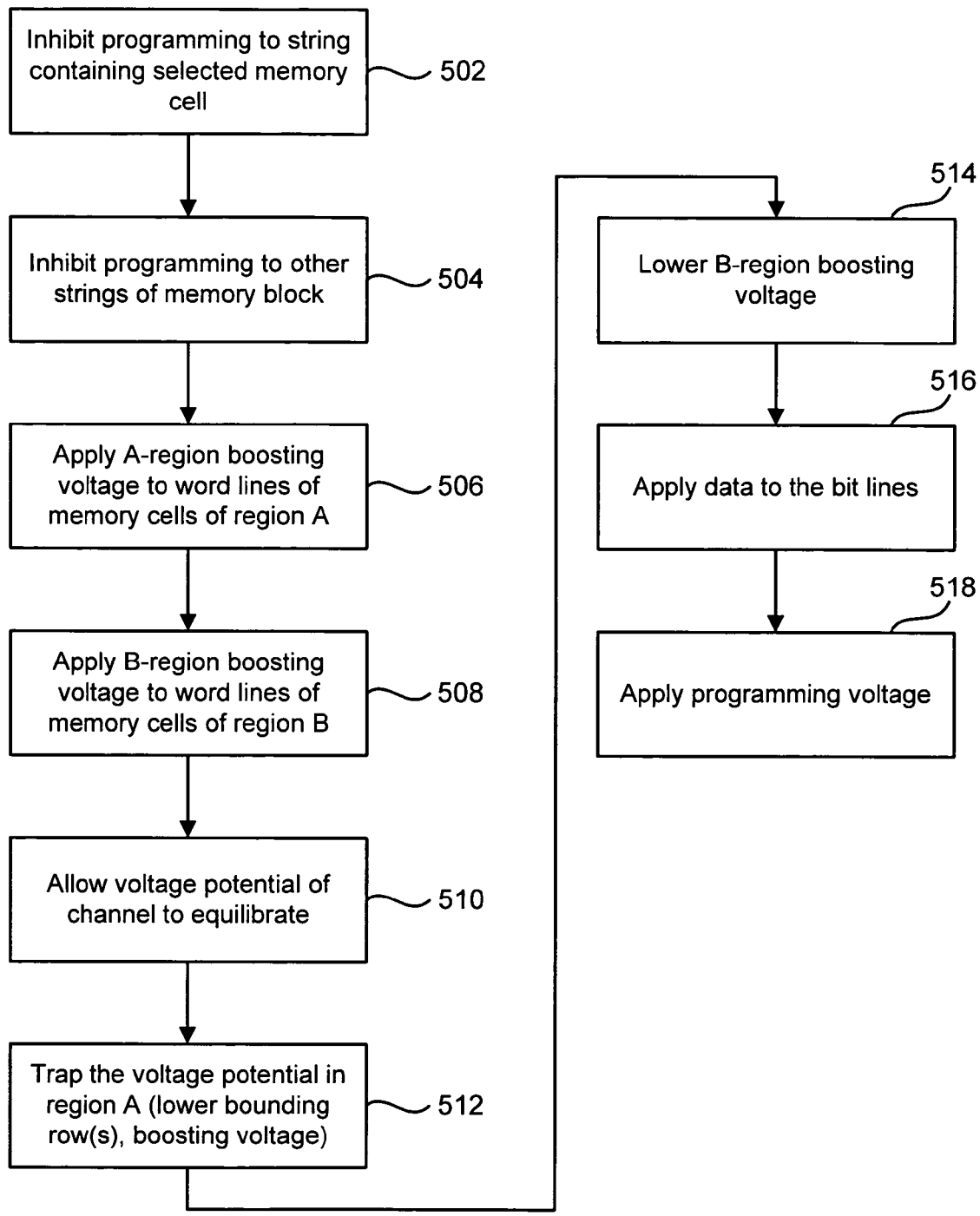
FIG. 13 is a flowchart for programming memory cells in accordance with one embodiment.

FIG. 13 is a flowchart in accordance with one embodiment for programming one or more NAND strings such as NAND string 440. In one embodiment, the flowchart of FIG. 13 can be performed at step 360 of FIG. 8 for applying a program pulse. The flowchart can be performed for each application of a program pulse. In another embodiment, the flowchart of FIG. 13 can be performed as part of applying one or more program pulses during the first and/or second programming passes of FIG. 11. At steps 502 and 504, programming to each NAND string for the memory block to be programmed is inhibited. Programming to a string can be inhibited by driving a voltage of about Vdd (e.g., 2.7V) to the bit lines of each string. A first boosting voltage ($V_{Aboost}$) is applied to the word lines of memory cells within region A at step 506. In the example of column 452, step 506 includes applying the A-region boosting voltage to memory cells 405, 406, 407, 408, 409, 410 and 411. A B-region boosting voltage ($V_{Bboost}$) is applied to the word lines of memory cells within region B at step 508. The B-region boosting voltage is applied to memory cells 400, 401, 402, 403, 404, 412, 413, 414 and 415 in the example of column 452. In addition to being higher than the A-region boosting voltage, the B-region boosting voltage can be substantially higher than a nominal voltage that can be used in accordance with prior art techniques before causing off-row disturb. For example, the B-region boosting voltage can range from 11V to 14V and higher in various embodiments. Because all strings have their bit lines connected to Vdd such that the strings are inhibited from programming, application of the large B-region boosting voltage will not cause program disturb to cells along the word lines to which it is applied.

In step 510, the voltage potential within the channel of the NAND string reaches equilibrium under application of the two boosting voltages. The time to reach such equilibrium is extremely short compared to that of a program pulse because of the relatively small RC time constants associated with each NAND string's channels and source/drain regions. Due to charge sharing, the voltage potential of the channel will reach a level between the individual regions' coupled voltages (i.e., between the isolated voltage potentials coupled within each region were the regions electrically isolated such that the individual potentials did not equilibrate). The voltage potential that develops within the channel of the NAND string is trapped within all or part of region A at step 512 (i.e., trapped in a portion that is less than the entire channel of the string). Subsequently, the voltage potential can be trapped within the portion of the channel as well as the N+ doped layers corresponding to region A. In one embodiment, the voltage potential is trapped within all or part of the channel region associated with region A by lowering the boosting voltage that is applied to the rows bordering or bounding region A. Referring again to the example illustrated in column 452, the bounding rows (designated A') correspond to WL5 and WL11 (memory cells 405 and 411). The A-region boosting voltage applied to cells 405 and 411 is lowered to a level sufficient to trap the voltage within the region associated with region A. Subsequently, the B-region boosting voltage is lowered at step 514. The boosting voltage is lowered from its substantially high level to a lower level that is still sufficient to support isolation of the trapped voltage potential within region A. The lower level is low enough to avoid program disturb when programming to a string is subsequently enabled. Data is subsequently applied to the bit lines of the NAND strings at step 516. Those NAND strings including a memory cell to be inhibited during the program operation have their bit lines remain at Vdd, while those having a memory cell to be programmed have their bit lines lowered to a program-enable voltage such as 0 volts. The trapped voltage is discharged for those NAND strings having a bit-line voltage driven to the program enable voltage (e.g., 0 volts) to enable programming. A programming voltage pulse is subsequently applied to the selected word line (e.g., WL8) at step 518. In one embodiment, the method of FIG. 13 is repeated for each incremental program voltage applied in sequential steps.

Figure 14:
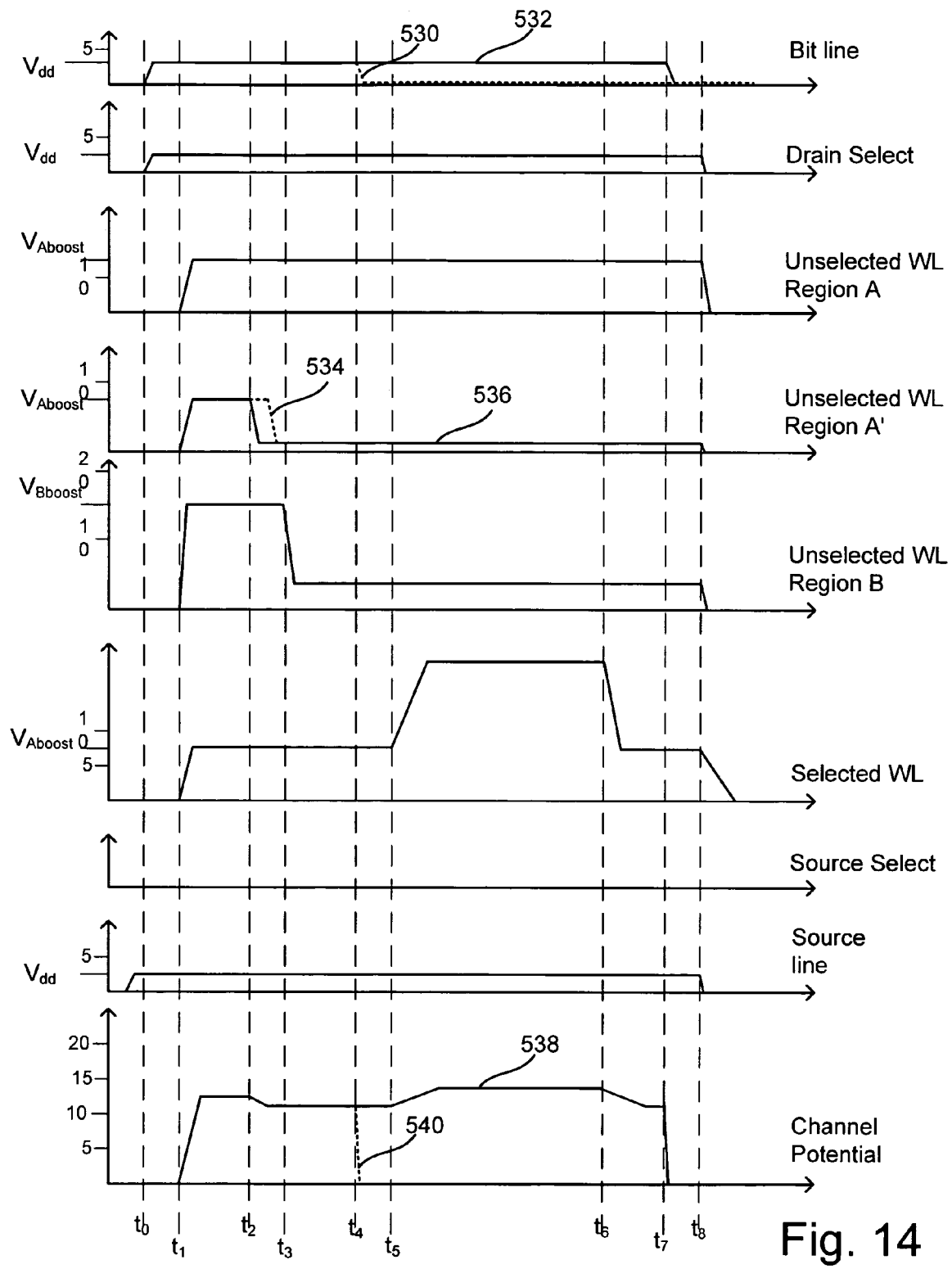
FIG. 14 is a timing diagram describing an embodiment for programming memory cells in accordance with one embodiment.

FIG. 14 depicts a method for programming memory cells in accordance with one embodiment and includes timing diagrams illustrating various applied and resulting voltages for a NAND string. At time $t_0$, a program inhibit voltage is driven on the bit lines of all strings of the memory block. The bit lines of all NAND strings containing a memory cell to be programmed or a memory cell to be inhibited are raised to a program-inhibit voltage such as Vdd. Also at time $t_0$, the source line and the gate of the drain select transistor are raised to Vdd. The gate of the source select transistor remains at 0V such that the transistor is off. At time $t_1$, the various boosting voltages are applied. The word lines associated with region A (including A') are raised to an A-region boosting voltage ($V_{Aboost}$). The word lines of region B are raised to a B-region boosting voltage ($V_{Bboost}$).

The resulting voltage potential of the channel is raised at $t_1$, due to capacitive coupling, to a level between those boosted levels achievable were regions A and B to be boosted individually. The overall channel and associated source/drain regions of the full NAND string can be coupled to a higher boosted voltage potential than that achievable by prior methods by application of the substantially higher boosting voltage to region B. This is a consequence of the voltage potential in the channel of the full NAND string being a weighted average of the boosting in region A and region B. Because each NAND string is inhibited from programming, a substantially higher boosting voltage can be applied to region B. It will be appreciated by those of ordinary skill in the art that the voltage values presented herein are exemplary and that other values can be used depending on such factors as specific cell threshold voltages, inter-oxide and junction capacitances, the chosen partitioning of the NAND string, as well as other chosen voltage levels.

To ensure proper boosting under the boosting voltages chosen, the control-gate boosting levels in region A can be driven sufficiently high to maintain the increased channel inversion levels imposed on region A by the relatively high voltages on the neighboring region B. The control gate boosting levels of region A can be driven sufficiently high to include accommodation of fully programmed cells having threshold voltages of, for example, about 3.5V. As with the B-region boosting voltage, the A-region boosting voltage can vary according to embodiment considering such factors as listed above. In one embodiment, for example, the A-region boosting voltage is 7V. In one embodiment, an A-region boosting voltage is chosen so as to minimize any potential off-row disturb while also fostering a maximum channel boosting in region A via elevated boosting from region B to minimize on-row disturb. It will be appreciated by those of ordinary sill in the art that junction/field plate breakdown can be considered in choosing boosting levels for region A and region B. A junction/field plate breakdown can occur if the portion of the channel associated with region A is boosted to a high potential compared with the voltage being applied to its control gate. This breakdown can introduce program disturb and should be considered when choosing A-region and B-region boosting voltages.

At time $t_2$, the voltage potential within the channel of the NAND string is trapped within all or part of that portion (less than all of the NAND string channel) of the channel that corresponds to region A. In one embodiment, the voltage potential is trapped by lowering the boosting voltage that is applied to one or more bounding rows (A'). Assuming the example of partitioning illustrated in column 452, the bounding rows (A') WL5 and WL11 are lowered to a level sufficient to trap the voltage within the channel region associated with region A. In one embodiment, the bounding rows are lowered to 0 volts. To support isolation of the trapped voltage on the source side of region A, the voltage on the bounding row of the source side (e.g., WL5) can be lowered to 0 volts, since there are no additional communication requirements in the source side direction. With respect to the bounding row on the bit line side (e.g., WL11), however, the lowered bounding row voltage can be chosen to maintain a sufficiently conductive path to the bit line of the NAND string if the bit line is later biased to a program enable potential (for strings that will be subsequently programmed). A lower level of the bounding row sufficient to maintain isolation on the bit line side can be determined from a combination of the threshold voltage of the bounding element and the bit line programming potential. For example, on the bit line side, the memory cell of the bounding row will always be in an erased state if the programming sequence is performed sequentially from the source side to the drain side. If the erased threshold voltage is guaranteed to be less than about 0 volts and the bit line program enable potential is also about 0 volts, then a low level of about 0.5V can be sufficient to maintain conduction, as well as to isolate the voltage potential within region A. The lower level for the bounding rows may be set closer to about 1V if the threshold voltage of an erased memory cell on the bit line side is only guaranteed to be less than or equal to about 0.5V or if the bit line program enable voltage can be about 0.5V (such as for some increased precision related programming operations). The 1V isolation voltage can ensure proper conduction and isolation of the voltage potential within region A. For more information relating to increased precision related programming, see U.S. patent application Ser. No. 10/766,217, entitled "Efficient Verification for Coarse/Fine Programming of Non-Volatile Memory," incorporated by reference herein in its entirety.

The channel voltage potential is reduced slightly when the channel potential is trapped within region A due to downward capacitive coupling of the bounding cells which now have lower boosting levels. This effect is illustrated in the channel potential timing diagram of FIG. 14 at time $t_2$. Since these bounding cells comprise a small portion of the NAND string, the capacitive coupling ratio of these elements to the full NAND string is small (for example, about 1/16 or 1/8 depending on the size of the NAND string). The p-channel is forced down in voltage to match that of the adjacent N+ doped source and drain so long as the channel potential associated with the bounding rows has the possibility of being higher than that of the neighboring source and/or drain's potential. This source and/or drain potential is a function of the maximum allowable surface potential that can sustain deep depletion in the absence of neighboring source/drain regions. This maximum potential can be determined by solving Gauss' law with a zero electron charge at the interface. Since the source/drain potentials are maintained capacitively (i.e. isolated from the source or bit line supply potentials), they will rise up to match the channel potential. The source/drain potentials and the channel potential will equilibrate to somewhere in between, given a weighted average of the two. In the end, an equipotential across the channel and source drain regions that is slightly less than the channel potential developed prior to trapping the voltage within the region associated with region A results.

In one embodiment, trapping of the voltage potential occurs as follows. After lowering the voltage on the bounding rows (as illustrated by line 536 at time $t_2$), the overall NAND string channel and source/drain potential will have dropped a relatively small fraction (e.g., about 0.1 volt or less per lowered volt applied to the bounding row control gates) because of the relatively small coupling ratio of the bounding elements to the whole set of elements in the NAND string. The maximum allowable surface potential in the channel of the bounding transistors will drop at a much faster rate (e.g., about 0.8 volts or more per volt on the bounding control gates) because the capacitance of the Si deep depletion region underlying the Si/SiO2 interface is a small fraction of that from the control gate to the Si/SiO2 interface. When the maximum allowable surface potential of the A'-region transistors drops below that of their neighboring source and drain regions, the A' channel regions go into cutoff (i.e. Vg−Vt<Vs & Vd), isolating the source and drain from one another. In this manner, the remaining potential on the source and drain is trapped. The net result is a trapping in region A of a voltage potential that has been elevated by boosting voltages applied to region B. Since the B-region boosting voltages can be relatively large due to the inhibited programming to all of the NAND strings independent of the data to be programmed, a relatively large voltage potential can be trapped in the A-region. For example, voltage potentials of 9V or greater can be trapped in the A-region without exposing the off-row cells to disturb.

After trapping the voltage within region A, the underlying channel region of region A, as well as its source/drain regions, are no longer in communication with those of region B. At time $t_3$, the B-region boosting voltage is lowered. In one embodiment, the B-region boosting voltage is lowered to a level which maintains underlying source/drain potential levels sufficiently high to establish adequate de-biasing voltage conditions between the source/drain regions of region B and the gates of the memory cells of the bounding rows. In one embodiment, the lower boosting level can be about 2 to 3 volts. In one embodiment, a lowered B-region boosting voltage of 2 to 3 volts is sufficient to maintain a conduction path from region A back to a programming biased bit line during a subsequent step. In one embodiment, the lowered boosting voltage level of region B is less than the voltage potential trapped in region A.

At time t4, the bit lines of the various NAND strings involved in the programming operation are biased according to the data to be written therein. For example, a program inhibit potential (e.g., Vdd) remains on the bit lines of those NAND strings containing memory cells that are not to be programmed during the operation. Those NAND strings containing a memory cell to be programmed during the program operation have their bit lines driven down to a program enable level (e.g., 0 volts). Referring to FIG. 14, line 532 represents the bit line voltage potential of NAND strings having memory cells to be inhibited during the program operation. As illustrated, line 532 remains at the potential Vdd after time t4. Line 530 represents the bit line voltage for NAND strings having a memory cell to be programmed during the programming operation. As can be seen, the bit line voltage for these NAND strings is lowered to 0 volts. By lowering the bit line voltage of a NAND string containing a memory cell to be programmed, the boosted voltage potential within the channel of such a NAND string will be discharged. The discharging of the channel of a NAND string containing a memory cell to be programmed is illustrated by line 540. Line 538 represents the channel potential for the NAND strings that continue to be inhibited from programming (e.g., bit lines remain at Vdd). It should be noted that a momentary hot electron surge can be introduced to those transistors forming part of a conduction path (e.g., bit line select and selected memory cell transistors) once a bit line is biased for programming and the channel suddenly discharges.

At time $t_5$, programming of the selected NAND strings begins. A program voltage pulse is applied to the word line corresponding to a memory cell to be programmed during the program operation. The program pulse also will be applied to memory cells to be inhibited by virtue of their being connected to the word line of a memory cell that is to be programmed. Accordingly, the control gate voltage for the selected memory cell will be raised to a level corresponding to the stage of programming. For example, if a program pulse of 20 volts is to be applied, the selected word line will be driven to 20 volts for a predetermined programming period. Application of a program voltage to the selected word line will cause the voltage potential of a channel of a NAND string inhibited from programming to increase according to the associated coupling ratio. This is illustrated in line 538 of the channel potential diagram of FIG. 14. The channel potential of the NAND strings to be inhibited remains at an elevated potential until after application of the program voltage is complete, time $t_6$. Discharge of these elevated channel potentials is accomplished by bringing corresponding bit lines to 0 volts at time $t_7$. Following this, all boosted word line voltages in regions A and B are returned to 0 volts at time $t_8$.

In one embodiment, the bounding rows on which the boosting voltage is lowered at time $t_2$ to trap the voltage in region A can come from region B in addition to or in place of region A. Column 454 of FIG. 12b illustrates a partition wherein the bounding rows, B', are part of region B. WL8 is still the selected word line for programming. WL9 and WL7 along with WL8 comprise the region A rows while WL0–WL6 and WL10–WL15 comprise the region B rows. The timing diagram for such a partitioning is substantially similar to that of FIG. 14. However, in place of an A' region (and the unselected WL Region A' potentials), there is a B' region and the unselected WL Region B' potentials. The unselected word lines of Region B' are driven with $V_{Bboost}$ at time $t_1$. At time $t_2$, the boosting voltage of the B' bounding rows are lowered to a voltage similar to that of A' of FIG. 14 to trap the elevated voltage potential within Region A. Because of the larger voltage drop of the B'-region at time $t_2$, the trapped voltage in the portion of the channel associated with Region A may be reduced by a larger amount at $t_2$ than illustrated in FIG. 14 when using A-region bounding rows. An advantage to selecting the bounding rows from within region A is that there is less overall voltage lowering involved. Because there is less overall voltage lowering involved, there is less associated capacitive coupling voltage drop on the trapped voltage in region A.

Figure 15:
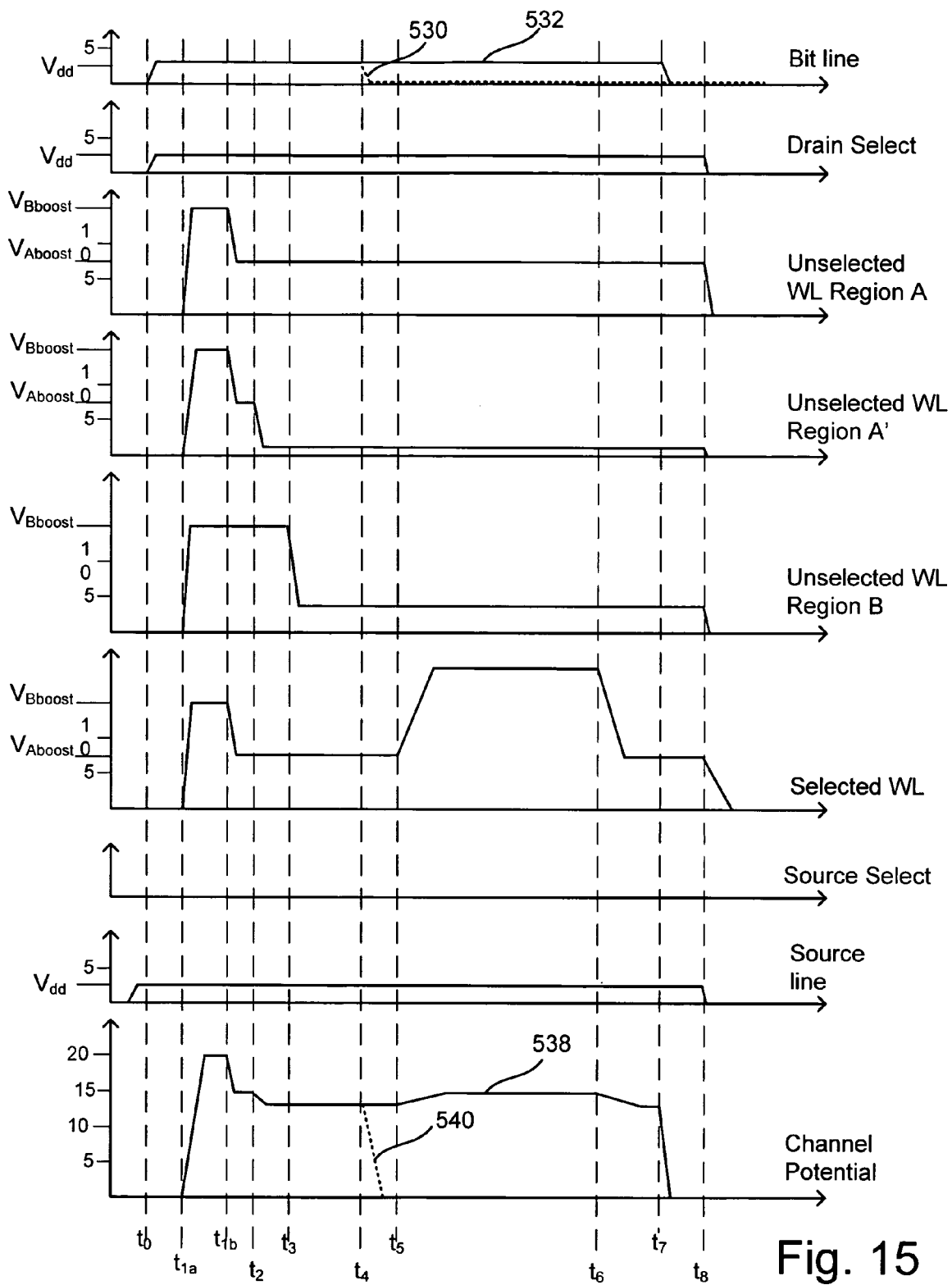
FIG. 15 is a timing diagram describing an embodiment for programming memory cells in accordance with another embodiment.

FIG. 15 depicts another method for programming memory cells in accordance with one embodiment. The method of FIG. 15 can address a tendency of the boosting potential of the A-region to be limited by channel cutoff of that portion of the NAND string channel. If the boosted voltage of region A is too small in relation to the boosted potential in region B, region A may only boost to the point of channel cutoff. The channel cutoff point is determined by a combination of the threshold voltage of the storage elements in region A (higher threshold voltages tend to cut off at lower boosting voltages) and the voltage level to which region B attempts to raise region A by capacitive coupling. The threshold voltage body effect (attempts to cut off the channel earlier) and the channel to floating gate coupling (tends to self-boost the floating gate) can affect this channel cut-off as well.

In the method depicted in FIG. 15, the A-region boosting voltage is the same as the B-region boosting voltage. At time $t_{1a}$, the word lines of region A, region A', and region B are raised to $V_{Bboost}$. Comparable channel boosting will occur as a result of application of the same boosting voltage as is illustrated. After the channel is boosted, the boosting voltages applied to region A and/or A' can be lowered to a sufficiently safe level (e.g., the level used in FIG. 14) at time $t_{1b}$. If a device drops into a cutoff condition, an elevated voltage potential will become trapped on the source/drain region adjacent the selected storage element. The elevated voltage potential will become the base inhibit voltage for that element. At time $t_2$, the region A bounding rows are dropped to the same level used in the method of FIG. 14, further isolating region A from region B as the region B boosting voltage is subsequently reduced. In accordance with the embodiment depicted in FIG. 15, the channel potential will fall at time $t_{1b}$ when the region A word lines are lowered and again at time $t_2$ when the bounding row word lines are lowered. As discussed, the bounding rows can be chosen from Region A or Region B.

In one embodiment, the sequence of lowering the boosting voltage applied to the bounding rows at time $t_2$ is not simultaneous. Implementations in accordance with various embodiments can benefit from various trapping sequences. In such embodiments, for a selected word line and A-region, the B-region is divided into two portions including a source side portion and a drain or bit line side portion. If the cutoff characteristics of the two bounding row control gates are similar, then sequencing may make little difference. However, in many scenarios the cutoff characteristics may be different. In one embodiment, a bounding row transistor that cuts off quicker than another boundary row transistor is delayed from having its boosting voltage lowered in order to cut the transistor off at approximately the same time as the slower transistor. Consider the partitioning illustrated in column 456 of FIG. 12b. The target address or selected word line is WL14. The A region is comprised of the addressed memory cell 414 and its immediate neighbors 415 and 413. If programming occurs from source side to drain side, the portion of the A-region on the bit line side will always be erased while the portion of the A-region of the source side may be programmed. A programmed transistor will cut off earlier than an erased transistor. Accordingly, the bit line boundary row (e.g., WL15) is lowered prior to the source side boundary row (e.g., WL13) in one embodiment. This technique is illustrated by line 534 in FIG. 14. Line 534 corresponds to a bounding row whose boosting voltage is lowered subsequent to lowering the boosting voltage on another bounding row (line 536). By dropping the bit line side device first, down coupling of the A-region's channel and source/drain region from the first cutoff operation is minimized due to the large capacitive reservoir maintained within the source side portion of the B-region.

In accordance with one embodiment, the A-region is defined as just the addressed memory cell and its two immediate neighbors as illustrated in column 456. The two immediate neighbors are used as the bounding rows to trap the high boosted voltage potentials in the two adjacent source/drain regions. If a selected memory cell is attached to WL15 or WL0, only one immediate neighbor is used and the A-region only includes one row or cell in addition to the addressed row or cell as illustrated in column 458. There is no bounding row on the drain side in this example. The target word line and storage element receive the boosting control gate voltage to insure conduction of the selected cell such the boosted voltage passes to the junctions adjacent the select transistor.

Although various partitioning schemes have been illustrated in the table of FIG. 12b, many other schemes can be used in accordance with embodiments. For example, it may be desired to maintain an overall number of A-region rows and an even distribution of A-region rows on both sides of a selected row. However, there may be too few rows on one side of the selected row to maintain an even distribution of A-region rows as the selected row nears the drain or source side of the string. In such a case, the overall number of rows for Region A can be decreased or more rows can be designated on one side or the other. The latter option is illustrated in column 460. In one embodiment, a bounding row is not used on one side as illustrated in column 458.

Elements programmed to high threshold voltages (e.g., 3V) provide less local boosting than elements in an erased state having low threshold voltages (e.g., ~0V). If a boosting voltage is optimized for cells in an erased state, the boosting voltage can be inadequate for cells in a programmed state since channel boosting will not start until the threshold voltage is reached. If the boosting voltage is optimized for cells in a programmed state, the boosting voltage can be too high and push the junctions of cells in an erased state into breakdown.

In accordance with one embodiment, a sacrificial boosting voltage is applied to provide a common starting condition for all elements of a NAND string. Prior to applying the A or B region boosting voltages (time $t_1$), such as at a time before $t_0$, a sacrificial boost (e.g., ~4V) can be applied to all memory cells of the NAND string. The sacrificial boost can be just below a level that will cause the aforementioned junction breakdown. The sacrificial boost can be applied with all the bit lines held at 0V. By establishing a starting voltage greater than the highest threshold voltage of any memory cell of the string, each memory cell of the string will be conductive irrespective of its individual threshold voltage. The sacrificial boost provides 0V in the channels and the underlying source/drain regions of the NAND string and a common starting voltage on all control gates of the string for subsequent boosting. After applying the sacrificial boost, all bit lines are brought to their inhibit voltages as illustrated at time $t_0$ of FIG. 14.

The above examples are provided with respect to NAND type flash memory. However, the principles of the present invention have application to other types of non-volatile memories which utilize boosting, including those currently existing and those contemplated to use new technology being developed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of programming non-volatile memory, comprising:
   boosting a voltage potential of a channel of a first plurality of non-volatile storage elements including a storage element to be inhibited from programming, each storage element of said first plurality is in communication with a first bit line receiving an inhibit voltage during said inhibiting;
   inhibiting programming of a second plurality of non-volatile storage elements during at least a portion of said boosting, said second plurality including a storage element to be programmed, each storage element of said second plurality is in communication with a second bit line receiving an inhibit voltage during said inhibiting;
   trapping at least a portion of said voltage potential in a portion of said channel associated with a first subset of said first plurality of non-volatile storage elements; and
   enabling programming of said second plurality of non-volatile storage elements subsequent to said step of trapping by applying a program enable voltage on said second bit line.

2. A method according to claim 1, wherein:
   said step of boosting includes applying a first boosting voltage to said first subset of said first plurality of non-volatile storage elements and applying a second boosting voltage to a second subset of said first plurality of non-volatile storage elements.

3. A method according to claim 2, further comprising:
   lowering said second boosting voltage prior to enabling programming to said second plurality of non-volatile storage elements, said step of lowering is commenced subsequent to said step of trapping.

4. A method according to claim 3, wherein:
   said lowering said second boosting voltage includes lowering said second boosting voltage for a first portion of said second subset and then lowering said second boosting voltage for a second portion of said second subset.

5. A method according to claim 2, wherein:
   said second subset includes all storage elements of said first plurality that are not included in said first subset.

6. A method according to claim 2, wherein:
   said step of boosting includes coupling said voltage potential onto said channel by applying said first boosting voltage and said second boosting voltage.

7. A method according to claim 1, further comprising:
   inhibiting programming of said first plurality of non-volatile storage elements during at least a portion of said step of boosting.

8. A method according to claim 1, wherein:
said step of trapping includes lowering a boosting voltage applied to at least one non-volatile storage element that bounds said first subset of non-volatile storage elements.

9. A method according to claim 8, wherein:
said at least one non-volatile storage element is part of said first subset of said first plurality of non-volatile storage elements.

10. A method according to claim 8, wherein:
said at least one non-volatile storage element is part of a second subset of said first plurality of non-volatile storage elements.

11. A method according to claim 8, wherein:
said at least one non-volatile storage element includes a first storage element and a second storage element, said lowering includes lowering said boosting applied to said first non-volatile storage element prior to lowering said boosting voltage applied to said second non-volatile storage element.

12. A method according to claim 1, wherein:
said first plurality of non-volatile storage elements is a first string of NAND storage elements;
said second plurality of non-volatile storage elements is a second string of NAND storage elements;
said first subset of said first plurality includes a storage element to be inhibited;
said second plurality includes a storage element to be programmed;
said storage element to be inhibited and said storage element to be programmed are both coupled to a first word line; and
said step of boosting includes applying at least one boosting voltage to said first plurality and said second plurality while inhibiting programming to said first plurality and said second plurality.

13. A method according to claim 1, wherein:
said first plurality of non-volatile storage elements is a first string of NAND storage elements, said first plurality includes a second subset of non-volatile storage elements;
said second plurality of non-volatile storage elements is a second string of NAND storage elements, said second plurality includes a third and fourth subset of non-volatile storage elements;
said first subset of said first plurality includes a storage element to be inhibited;
said third subset of said second plurality includes a storage element to be programmed;
said storage element to be inhibited and said storage element to be programmed are both coupled to a first word line; and
said step of boosting includes applying a first boosting voltage to said first subset of said first plurality and said third subset of said second plurality and applying a second boosting voltage to said second subset of said first plurality and said fourth subset of said second plurality.

14. A method according to claim 1, wherein:
said first plurality of non-volatile storage elements is a first string of NAND storage elements, said first plurality includes a second subset of non-volatile storage elements;
said second plurality of non-volatile storage elements is a second string of NAND storage elements, said second plurality includes a third and fourth subset of non-volatile storage elements;
said first subset of said first plurality includes a storage element to be inhibited;
said first subset of said first plurality includes at least one bounding storage element;
said third subset of said second plurality includes a storage element to be programmed;
said storage element to be inhibited and said storage element to be programmed are both coupled to a first word line;
one or more first additional word lines couple to other storage elements of said first subset of said first plurality and said third subset of said second plurality;
one or more second additional word lines couple to other storage elements of said second subset of said first plurality and said fourth subset of said second plurality;
said method further includes inhibiting programming of said first plurality of non-volatile storage elements and said second plurality of non-volatile storage elements prior to said step of boosting;
said step of boosting includes applying a first boosting voltage to said first subset of said first plurality and said third subset of said second plurality and applying a second boosting voltage to said second subset of said first plurality and said fourth subset of said second plurality;
said step of trapping includes lowering said first boosting voltage for said at least one bounding storage element; and
said method further includes lowering said second boosting voltage prior to enabling programming to said second plurality of non-volatile storage elements, said step of lowering said second boosting voltage is commenced subsequent to said step of trapping.

15. A method according to claim 1, wherein:
said first plurality of non-volatile storage elements is a first string of NAND storage elements, said first plurality includes a second subset of non-volatile storage elements;
said second plurality of non-volatile storage elements is a second string of NAND storage elements, said second plurality includes a third and fourth subset of non-volatile storage elements;
said first subset of said first plurality includes a storage element to be inhibited;
said second subset of said first plurality includes at least one bounding storage element that bounds said first subset;
said third subset of said second plurality includes a storage element to be programmed;
said storage element to be inhibited and said storage element to be programmed are both coupled to a first word line;
one or more first additional word lines couple to other storage elements of said first subset of said first plurality and said third subset of said second plurality;
one or more second additional word lines couple to other storage elements of said second subset of said first plurality and said fourth subset of said second plurality;
said method further includes inhibiting programming of said first plurality of non-volatile storage elements and said second plurality of non-volatile storage elements prior to said step of boosting;
said step of boosting includes applying a first boosting voltage to said first subset of said first plurality and said third subset of said second plurality and applying a second boosting voltage to said second subset of said first plurality and said fourth subset of said second plurality;

said step of trapping includes lowering said second boosting voltage for said at least one bounding storage element; and said method further includes lowering said second boosting voltage for all remaining storage elements of said second subset of said first plurality and said fourth subset of said second plurality prior to enabling programming to said second plurality, said step of lowering said second boosting voltage for all remaining storage elements is commenced subsequent to said step of trapping.

16. A method according to claim 1, wherein:
said first subset of said first plurality of non-volatile storage elements includes a storage element to be inhibited.

17. A method according to claim 16, wherein:
said first subset of said first plurality of non-volatile storage elements further includes a source side non-volatile storage element adjacent to said storage element to be inhibited.

18. A method according to claim 16, wherein:
said first subset of said first plurality of non-volatile storage elements further includes a drain side non-volatile storage element adjacent to said storage element to be inhibited.

19. A method according to claim 16, wherein:
said first subset further includes two source side non-volatile storage elements adjacent to said storage element to be inhibited and two drain side non-volatile storage elements adjacent to said storage element to be inhibited.

20. A method according to claim 1, wherein:
said first plurality of non-volatile storage elements is a first string of NAND storage elements; and
said second plurality of non-volatile storage elements is a second string of NAND storage elements.

21. A method according to claim 1, wherein:
said first plurality of non-volatile storage elements and said second plurality of non-volatile storage elements are pluralities of flash memory devices.

22. A method according to claim 1, wherein:
said first plurality and said second plurality are part of an array of non-volatile storage elements;
said array is in communication with a host system; and
said array is removable from said host system.

23. A method according to claim 1, wherein:
said first plurality and said second plurality are part of an array of non-volatile storage elements;
said array is in communication with a host system; and
said array is embedded in said host system.

24. A method according to claim 1, wherein:
said first plurality of non-volatile storage elements and said second plurality of non-volatile storage elements are pluralities of multi-state non-volatile storage elements.

25. A method of programming non-volatile memory, comprising:
boosting a voltage potential of a channel of a first group of non-volatile storage elements;
trapping at least a portion of said voltage potential in a portion of said channel associated with a first subset of said first group of non-volatile storage elements;
enabling programming of a second group of non-volatile storage elements subsecuent to said step of trapping;
said step of boosting includes applying a first boosting voltage to said first subset of said first group of non-volatile storage elements and applying a second boosting voltage to a second subset of said first group of non-volatile storage elements; and
said first boosting voltage is lower than said second boosting voltage.

26. A method according to claim 25, wherein:
said at least a portion of said voltage potential is higher than an isolated voltage potential of said portion of said channel associated with said first subset resulting from applying said first boosting voltage and lower than an isolated voltage potential of a portion of said channel associated with said second subset resulting from applying said second boosting voltage.

27. A method according to claim 25, wherein:
said second boosting voltage is large enough to cause undesired programming of one or more non-volatile storage elements of said second subset of non-volatile storage elements when programming of said second subset is enabled.

28. A method of programming non-volatile memory, comprising:
boosting a voltage potential of a channel of a first group of non-volatile storage elements;
trapping at least a portion of said voltage potential in a portion of said channel associated with a first subset of said first group of non-volatile storage elements;
enabling programming of a second group of non-volatile storage elements subseciuent to said step of trapping;
said step of boosting includes applying a first boosting voltage to said first subset of said first group of non-volatile storage elements and applying a second boosting voltage to a second subset of said first group of non-volatile storage elements; and
said step of boosting further includes applying said first boosting voltage to a third subset of said second group of non-volatile storage elements and applying said second boosting voltage to a fourth subset of said second group of non-volatile storage elements.

29. A method according to claim 28, wherein:
non-volatile storage elements of said first group share common word lines with corresponding non-volatile storage elements of said second group;
said first subset of said first group includes a non-volatile storage element to be inhibited; and
said third subset of said second group includes a non-volatile storage element to be programmed.

30. The method of claim 28, wherein:
said first boosting voltage and said second boosting voltage are equal.

31. The method of claim 28, wherein:
said first boosting voltage is lower than said second boosting voltage.

32. A non-volatile memory system, comprising:
a first group of non-volatile storage elements, said first group including a first and second subset of non-volatile storage elements, said first subset of said first group including a non-volatile storage element to be inhibited;
a second group of non-volatile storage elements, said second group including a third and fourth subset of non-volatile storage elements, said third subset of said second group including a non-volatile storage element to be programmed; and
a plurality of word lines coupled to said first group and said second group to apply one or more boosting voltages to raise a voltage potential of a channel of said first group, said plurality of word lines includes a first word line coupled to said storage element to be inhibited and to said storage element to be programmed, said first word line applies a program voltage to said storage element to be programmed during a program operation, said plurality of word lines includes a first bounding word line on a source side of said first word line and a second bounding word line on a drain side of said first word line, said first and second bounding word lines have said one or more boosting voltages lowered thereon, prior to applying said program voltage on said first word line, in order to trap said voltage potential in a portion of said channel associated with said first subset of said first group.

33. A memory system according to claim 32, wherein:
said plurality of word lines includes a first plurality of word lines coupled to said first subset of said first group and said third subset of said second group to apply a first boosting voltage; and
said plurality of word lines includes a second plurality of word lines coupled to said second subset of said first group and said fourth subset of said second group to apply a second boosting voltage.

34. A memory system according to claim 33, wherein:
said first bounding word line and said second bounding word line are part of said first plurality of word lines.

35. A memory system according to claim 33, wherein:
said first bounding word line and said second bounding word line are part of said second plurality of word lines.

36. A memory system according to claim 33, wherein:
said voltage potential of said channel is a capacitively coupled voltage potential resulting from said first boosting voltage and said second boosting voltage.

37. A memory system according to claim 33, wherein:
said voltage potential of said channel is higher than an isolated voltage potential of said portion of said channel associated with said first subset resulting from applying said first boosting voltage and lower than an isolated voltage potential of a portion of said channel associated with said second subset resulting from applying said second boosting voltage.

38. A memory system according to claim 33, further comprising:
a plurality of bit lines including a first bit line coupled to said first group and a second bit line coupled to said second group, said first bit line applies a program inhibit voltage to said first group and said second bit line applies a program inhibit voltage to said second group while said second plurality of word lines applies said second boosting voltage.

39. A memory system according to claim 32, wherein:
said first group of non-volatile storage elements is a first string of NAND flash memory devices; and
said second group of non-volatile storage elements is a second string of NAND flash memory devices.

40. A memory system according to claim 32, wherein:
said first group of non-volatile storage elements and said second group of non-volatile storage elements are groups of multi-state flash memory devices.

41. A memory system according to claim 32, wherein:
said first group and said second group are part of an array of non-volatile storage elements;
said array is in communication with a host system; and
said array is removable from said host system.

42. A memory system according to claim 32, wherein:
said first group and said second group are part of an array of non-volatile storage elements;
said array is in communication with a host system; and
said array is embedded in said host system.

43. A non-volatile memory system, comprising:
a first group of non-volatile storage elements, said first group including a first and second subset of non-volatile storage elements, said first subset of said first group including a non-volatile storage element to be inhibited;
a second group of non-volatile storage elements, said second group including a third and fourth subset of non-volatile storage elements, said third subset of said second group including a non-volatile storage element to be programmed;
a plurality of word lines coupled to said first group and said second group to apply one or more boosting voltages to raise a voltage potential of a channel of said first group, said plurality of word lines includes a first word line coupled to said storage element to be inhibited and to said storage element to be programmed, said first word line applies a program voltage to said storage element to be programmed during a program operation, said plurality of word lines includes at least one bounding word line having said one or more boosting voltages lowered thereon, prior to applying said program voltage on said first word line, in order to trap said voltage potential in a portion of said channel associated with said first subset of said first group, said plurality of word lines includes a first plurality of word lines coupled to said first subset of said first group and said third subset of said second group to apply a first boosting voltage, said plurality of word lines includes a second plurality of word lines coupled to said second subset of said first group and said fourth subset of said second group to apply a second boosting voltage; and
a plurality of bit lines including a first bit line coupled to said first group and a second bit line coupled to said second group, said second bit line has a program enable voltage applied thereon subsequent to said second plurality of word lines having said second boosting voltage lowered thereon.

44. A memory system according to claim 43, wherein:
said second plurality of word lines has said second boosting voltage lowered thereon prior to said first word line applying said program voltage.

45. A memory system according to claim 44, wherein:
said second plurality of word lines applies a lower second boosting voltage while said second bit line has a program enable voltage applied thereon.

46. The method of claim 43, wherein:
said first boosting voltage and said second boosting voltage are equal.

47. The method of claim 43, wherein:
said first boosting voltage and said second boosting voltage are not equal.

48. A method of programming non-volatile memory, comprising:
boosting a voltage potential of a channel of a first group of non-volatile storage elements and a channel of a second group of non-volatile storage elements by applying a first boosting voltage to a first plurality of word lines and a second boosting voltage to a second plurality of word lines, said first group includes a storage element to be programmed and said second group includes a storage element to be inhibited from programming, said first plurality of word lines is coupled to a first subset of non-volatile storage elements of said first group and a third subset of non-volatile storage elements of said second group of non-volatile storage elements, said second plurality of word lines is coupled to a second subset of non-volatile storage elements of said first group and a fourth subset of non-volatile storage elements of said second group;

trapping at least a portion of said voltage potential in a portion of said channel of said first group associated with said first subset of non-volatile storage elements;

lowering said second boosting voltage; and programming said storage element to be programmed subsequent to said step of lowering said second boosting voltage, said programming includes draining at least a portion of said boosted voltage potential from said channel of said first group.

49. A method of programming non-volatile memory, comprising:

inhibiting programming of a first plurality of non-volatile storage elements and a second plurality of non-volatile storage elements by applying a program inhibit voltage to a first bit line in communication with each storage element of said first plurality and applying a program inhibit voltage to a second bit line in communication with each storage element of said second plurality, said first plurality including a non-volatile storage element to be inhibited, said second plurality including a non-volatile storage element to be programmed;

applying a first boosting voltage to a first subset of non-volatile storage elements of said first plurality and a second boosting voltage to a second subset of non-volatile storage elements of said first plurality to boost a voltage potential of a channel of said first plurality of non-volatile storage elements;

applying said first boosting voltage to a third subset of non-volatile storage elements of said second plurality and said second boosting voltage to a fourth subset of non-volatile storage elements of said second plurality to boost a voltage potential of a channel of said second plurality of non-volatile storage elements, said applying said first boosting voltage and said second boosting voltage is performed while inhibiting programming of said second plurality including said non-volatile storage element to be programmed;

trapping said voltage potential in a portion of said channel associated with said first subset of storage elements;

lowering said second boosting voltage for said second subset and said fourth subset; and applying a program enable voltage to said second bit line subsequent to said step of lowering said second boosting voltage.

50. A method according to claim 49, wherein:

said first plurality of non-volatile storage elements is a first string of NAND storage elements;

said second plurality of non-volatile storage elements is a second string of NAND storage elements, said second plurality includes a third and fourth subset of non-volatile storage elements;

said first subset of said first plurality includes a storage element to be inhibited;

said first subset of said first plurality includes at least one bounding storage element;

said third subset of said second plurality includes a storage element to be programmed;

said storage element to be inhibited and said storage element to be programmed are both coupled to a first word line;

one or more first additional word lines couple to other storage elements of said first subset of said first plurality and said third subset of said second plurality;

one or more second additional word lines couple to other storage elements of said second subset of said first plurality and said fourth subset of said second plurality; and said step of trapping includes lowering said first boosting voltage for said at least one bounding storage element.

51. A method according to claim 49, wherein:

said first plurality of non-volatile storage elements is a first string of NAND storage elements;

said second plurality of non-volatile storage elements is a second string of NAND storage elements, said second plurality includes a third and fourth subset of non-volatile storage elements;

said first subset of said first plurality includes said storage element to be inhibited;

said second subset of said first plurality includes at least one bounding storage element that bounds said first subset;

said third subset of said second plurality includes a storage element to be programmed;

said storage element to be inhibited and said storage element to be programmed are both coupled to a first word line;

one or more first additional word lines couple to other storage elements of said first subset of said first plurality and said third subset of said second plurality;

one or more second additional word lines couple to other storage elements of said second subset of said first plurality and said fourth subset of said second plurality;

said step of trapping includes lowering said second boosting voltage for said at least one bounding storage element; and said step of lowering said second boosting voltage for said second subset comprises lowering said second boosting voltage for all remaining storage elements prior to programming said second plurality, said step of lowering said second boosting voltage for all remaining storage elements is commenced subsequent to said step of trapping.

said first boosting voltage is lower than said second boosting voltage.

* * * * *